US012751004B2

(12) United States Patent
van Dal et al.

(10) Patent No.: US 12,751,004 B2
(45) Date of Patent: Sep. 29, 2026

(54) FLASH MEMORY WITH STACKABLE MEMORY CELLS

(71) Applicant: Taiwan Semiconductor Manufacturing Company, Ltd., Hsinchu (TW)

(72) Inventors: Marcus Johannes Henricus van Dal, Linden (BE); Gerben Doornbos, Kessel-Lo (BE); Georgios Vellianitis, Heverlee (BE); Oreste Madia, Brussels (BE)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 493 days.

(21) Appl. No.: 18/319,703

(22) Filed: May 18, 2023

(65) Prior Publication Data

US 2024/0389315 A1 Nov. 21, 2024

(51) Int. Cl.
*H10B 41/27* (2023.01)
*H10B 41/30* (2023.01)

(52) U.S. Cl.
CPC ............. *H10B 41/27* (2023.02); *H10B 41/30* (2023.02)

(58) Field of Classification Search
CPC ................................ H10B 41/27; H10B 41/30
See application file for complete search history.

(56) References Cited

U.S. PATENT DOCUMENTS 11,164,882 B2 * 11/2021 Kwon .................... H10B 41/35
12,101,928 B2 * 9/2024 Fukuda .................. H10B 41/10
2015/0371709 A1 * 12/2015 Kai .................... G11C 16/0425 365/185.17
2016/0163729 A1 6/2016 Zhang et al.
2016/0240631 A1 8/2016 Chung et al.
2017/0194340 A1 7/2017 Lue
2018/0366478 A1 12/2018 Yi et al.
2019/0006380 A1 1/2019 Liu et al.
2022/0254798 A1 8/2022 Said et al.

FOREIGN PATENT DOCUMENTS

TW 201911301 A 3/2019
TW 202023033 A 6/2020
TW I795847 B 3/2023

OTHER PUBLICATIONS

U.S. Appl. No. 18/152,160, filed Jan. 10, 2023.
U.S. Appl. No. 18/306,488, filed Apr. 25, 2023.

* cited by examiner

*Primary Examiner* — Richard A Booth

(74) *Attorney, Agent, or Firm* — Eschweiler & Potashnik, LLC

(57) ABSTRACT

Some embodiments relate to a memory cell. The memory cell includes a channel layer disposed over a substrate and extended along a vertical direction. A floating gate is disposed over the substrate and separated from the channel layer by a gate dielectric along a first lateral direction. A control gate is disposed on one side of the floating gate and the channel layer along the first lateral direction and separated from the floating gate by a tunnel dielectric. A pair of source/drain terminals is disposed on the other side of the channel layer and the floating gate opposite to the control gate.

20 Claims, 33 Drawing Sheets

FLASH MEMORY WITH STACKABLE MEMORY CELLS

BACKGROUND

Many modern day electronic devices contain electronic memory. Electronic memory may be volatile memory or non-volatile memory. Non-volatile memory is able to retain its stored data in the absence of power, whereas volatile memory loses its stored data when power is lost. Flash memory is one type of non-volatile memory that utilizes the tunneling of electrons into and out of a floating gate in order to change the threshold voltage of the memory cell. The tunneling of electrons is induced by applying a program voltage or an erase voltage to the control gate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
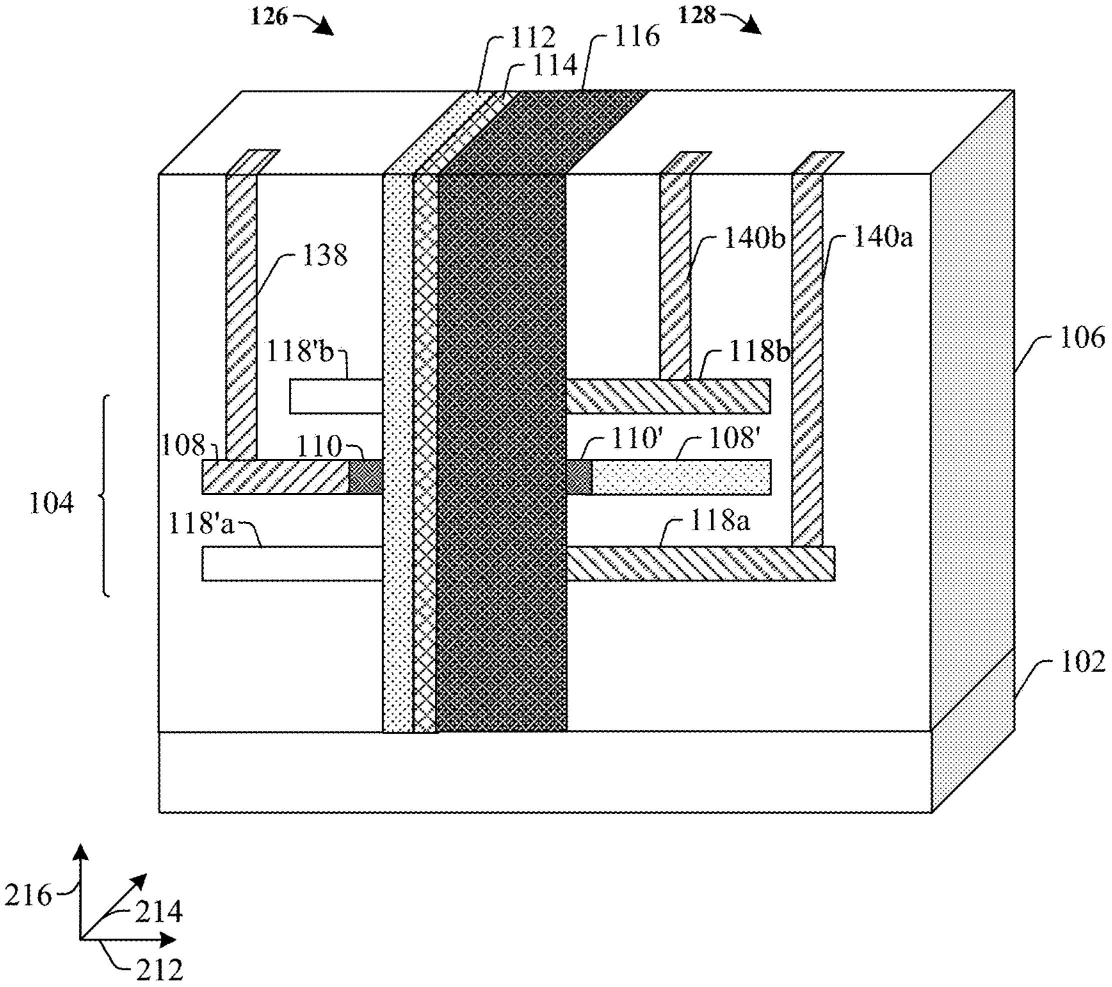
FIG. 1 illustrates a 3D view of some embodiments of a memory device with a stackable memory cell.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s)

as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Flash memory consists of memory cells with floating-gate transistors respectively including a control gate configured to control current flow in a channel layer between a source terminal and a drain terminal and a floating gate disposed between the control gate and the channel layer. Each memory cell stores one or more bits of information as an electrical charge in the floating gate. The floating gate is isolated from the rest of the circuitry by an insulating layer and is programmed by applying a program voltage to the control gate, which causes electrons to tunnel through the insulating layer and trapped in the floating gate. Erasing flash memory involves removing the charge from the floating gate. An erase voltage may be applied to the control gate, which causes the electrons to tunnel back through the insulating layer and return to the source. To read the data stored in a memory cell, a read voltage is applied to the control gate, and the resulting current is measured. The current is either high or low, depending on a greater or smaller threshold voltage based on whether the floating gate is charged or not, and thus indicating a 1 or 0 bit respectively. As flash memory scales down in size, memory cells with smaller size and greater density are desired. In addition, as different configurations of logic devices have been developed, such as fin field-effect transistors (FinFETS) and gate-all-around field-effect transistors (GAA-FETS), it is increasingly difficult to utilize the processes used to make logic devices to also fabricate memory cells.

In view of the above, the present disclosure provides techniques to form a flash memory with stackable memory cells, and an associated manufacturing method. The flash memory is integrated in a back end of line (BEOL) process. Compared to conventional memory devices, where the memory cells and logic devices are integrated in the same front end of line (FEOL) process on a substrate, embedding the memory cells in the BEOL process would reduce chip size and provide for a much-increased device density per chip area and also provide process flexibility for other FEOL devices. In some embodiments, the flash memory comprises a memory cell including a channel layer and a floating gate separated by a gate dielectric and disposed over a substrate and extended along a vertical direction in perpendicular to a surface of the substrate. A control gate is disposed on one side of the floating gate and the channel layer and separated from the floating gate by a tunnel dielectric. A pair of source/drain terminals is disposed on the other side of the channel layer and the floating gate opposite to the control gate. By arranging the channel layer along the vertical direction and arranging the control gate and the pair of source/drain terminals on opposite sides of the floating gate and the channel layer along the first lateral direction, additional memory cells can be stacked along the vertical direction sharing the channel layer, and thus achieving a compact memory cell array with greater cell density. Following descriptions are associated with figures providing more detailed embodiments and examples of structures and manufacturing methods of a memory device including stackable memory cells in a vertical direction.

FIG. 1 illustrates a 3D view of some embodiments of a memory device with stackable memory cells. As shown in FIG. 1, a memory cell 104 is disposed over a substrate 102 within a plurality of interlayer dielectric (ILD) layers 106. The substrate 102 may be any type of substrate, such as comprising a semiconductor body and/or epitaxial layers, e.g., silicon, SiGe, silicon-on-insulator (SOI), or the like. The ILD layers 106 may be or be comprised of dielectric material such as silicon dioxide ($SiO_2$) or the like. In some embodiments, FEOL devices, such as logic devices, plugs, and one or more lower interconnects (e.g., conductive contacts, interconnect vias, and/or interconnect wires connected to the logic devices) may be disposed between the substrate 102 and the memory cell 104. The logic devices may be or comprise metal-oxide-semiconductor field-effect transistors (MOSFETs), fin field-effect transistors (FinFETs), gate-all-around field-effect transistors (GAA FETs), nanosheet field-effect transistors, the like, or any combination of the foregoing. The use of BEOL processes to form memory devices results in a more flexible integrated circuit design that may utilize ongoing developments in transistor technology.

In some embodiments, the memory cell 104 comprises a channel layer 116 extended along a vertical direction 216. In some embodiments, the vertical direction 216 is defined as a direction that is in perpendicular to an upper surface of the substrate 102, along which other FEOL devices, such as logic devices coupled to the memory cell are disposed thereon. In some embodiments, the channel layer 116 is or comprises, an oxide semiconductor (OS) material, for example, indium gallium zinc oxide (InGaZnO), indium oxide (InO), indium tin oxide (InSnO), indium zinc oxide (InZnO), indium tungsten oxide (InWO), or the like. A floating gate 112 is disposed over the substrate 102 and separated from the channel layer 116 by a gate dielectric 114 along a first lateral direction 212. The first lateral direction 212 is perpendicular to the vertical direction 216 and in plane with the upper surface of the substrate 102. The floating gate 112 is or is comprised of, for example, titanium nitride (TiN), tantalum nitride (TaN), a titanium aluminum alloy (TiAl), heavily doped polysilicon, a combination of the foregoing, or the like.

A control gate 108 is disposed on one side of the floating gate 112 and the channel layer 116. For example, the control gate 108 may be disposed at a first side 126, e.g., left side of the channel layer 116 and the floating gate 112 along the first lateral direction 212. The control gate 108 may be separated from the floating gate 112 by a tunnel dielectric 110. In some embodiments, the floating gate 112 has a first sidewall and a second sidewall separated in the first lateral direction 212. The tunnel dielectric 110 and the control gate 108 are closer to the first sidewall than the second sidewall. The gate dielectric 114 may directly contact the second sidewall. In some embodiments, the tunnel dielectric 110 is or comprises, for example, one of silicon dioxide ($SiO_2$), silicon nitride ($Si_3N_4$), silicon oxynitride (SiON), a combination of the foregoing, or the like.

A pair of source/drain terminals 118*a*, 118*b* is disposed on the other side of the channel layer 116 and the floating gate 112 opposite to the control gate 108. For example, the pair of source/drain terminals 118*a*, 118*b* may be disposed at a second side 128, e.g., right side of the channel layer 116 and the floating gate 112 along the first lateral direction 212. In some embodiments, the source/drain terminals 118 or the control gate 108 are or is comprised of, for example, titanium nitride (TiN), tungsten (W), copper (Cu), ruthenium (Ru), cobalt (Co), nickel (Ni), nickel silicide (NiSi), a combination of the foregoing, or the like.

In some embodiments, a gate contact 138 is disposed on an upper surface of the control gate 108 on the first side 126. A first source/drain contact 140*a* is disposed on an upper surface of a first source/drain terminal 118*a* of the pair of source/drain terminals, and a second source/drain contact 140*b* is disposed on an upper surface of a second source/drain terminal 118*b* of the pair of source/drain terminals. The gate contact 138, the first source/drain contact 140*a*, and the second source/drain contact 140*b* are laterally shifted from one another and extended upwardly along the vertical direction 216. In some embodiments, the gate contact 138, the first source/drain contact 140*a*, and the second source/drain contact 140*b* are shifted in the first lateral direction, the second lateral direction, or both the first lateral direction and the second lateral direction. In some embodiments, the gate contact 138, the first source/drain contact 140*a*, and the second source/drain contact 140*b* may be extended and coupled to interconnect wires of one single metal layer. In other embodiments, one or more of the gate contact 138, the first source/drain contact 140*a*, and the second source/drain contact 140*b* may be extended and coupled to interconnect wires of different metal layers for a more flexible wire routing.

The control gate 108, the tunnel dielectric 110, and the floating gate 112 may function as a metal-insulator-metal (MIM) capacitor, providing charge storage. The transfer of electrons through the tunnel dielectric 110 between the control gate 108 and the floating gate 112 results in the memory cell 104 with a more flexible design than memory cells which transfer electrons between the channel layer and the floating gate. For example, by reducing sizes of the control gate 108 and tunnel dielectric 110 the memory cell 104 may have a lower program voltage, since capacitance of the MIM capacitor is therefore reduced. In addition, in some embodiments, the gate dielectric 114 may be or be comprised of ferroelectric material, which can be used to store the polarization of the electric field. The stored polarization facilitates retaining charge in the floating gate 112 and thus improving the retention of the memory cell 104.

In some embodiments, a dummy control gate 108' is disposed on the second side 128 and vertically between the pair of source/drain terminals 118*a*. 118*b*. In additional, A pair of dummy source/drain terminals 118'*a*, 118'*b* may be disposed on the first side 126 and vertically separated by the control gate 108. For example, the dummy control gate 108' and a dummy tunnel dielectric 110' may be disposed on the other side of the channel layer 116 opposite to the floating gate 112, the tunnel dielectric 110, and the control gate 108. The pair of dummy source/drain terminals 118'*a*, 118'*b* is disposed on the other side of the floating gate 112 opposite to the channel layer 116 and the pair of source/drain terminals 118*a*, 118*b*.

In some embodiments, the dummy control gate 108' and the pair of dummy source/drain terminals 118'*a* and 118'*b* are of different conductive materials. For example, the dummy control gate 108' may be of the same conductive material as the control gate 108, such as nickel (Ni). The pair of dummy source/drain terminals 118'*a*, 118'*b* may be of the same conductive material as of the pair of source/drain terminals 118*a*, 118*b*, such as titanium nitride (TiN). In some other embodiments, the dummy control gate 108' and the pair of dummy source/drain terminals 118'*a*, 118'*b* are of different semiconductor materials. For example, the dummy control gate 108' may be or be comprised of silicon germanium while the pair of dummy source/drain terminals 118'*a*, 118'*b* may be or be comprised of silicon, or vice versa.

During operation, when a program or an erase voltage is applied to the MIM capacitor, a charge can be stored or removed in the floating gate 112 representing 1 bit of information by being in a “0” state or a “1” state. Supplying the program voltage (e.g., in a "program" operation) or the erase voltage (e.g., in an "erase" operation) at the control gate 108 may change the state of the memory cell from a "0" state to a "1" state or from a "1" state to a "0" state, respectively. The charge stored in the floating gate 112 is changed by electrons tunneling into and out of the floating gate 112 through the tunnel dielectric 110.

The charge alters the threshold voltage of the memory cell, which changes whether a current is detected through the channel layer 116 or not during a "read" operation. For example, when a program voltage is supplied to the control gate 108, electrons are drawn out of the floating gate 112, resulting in the floating gate 112 having a positive charge, which sets the memory cell with a first threshold. When an erase voltage is supplied to the control gate 108, electrons are pushed into the floating gate 112, resulting the floating gate 112 having a negative charge, which raises the voltage threshold of the memory cell 104 to a second threshold higher than the first threshold. A read voltage is set between the first threshold and the second threshold. When the read voltage is provided to the control gate 108 during a "read" operation, if the memory cell 104 is in a first state with the first threshold, a current flow through the channel layer 116, indicating the memory cell is in a first state (e.g., "1"). If the memory cell 104 is in a second state with the second threshold, no current or a smaller current flow through the channel layer 116, indicating the memory cell is in a second state (e.g., "0"). The read voltage may be smaller than the program voltage to not write in the memory cell 104 but greater than the voltage threshold to turn on the channel layer 116.

FIGS. 2-7 illustrate a series of cross-sectional views of some embodiments of a method of forming a memory device with stackable memory cells. Although FIGS. 2-7 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 2:
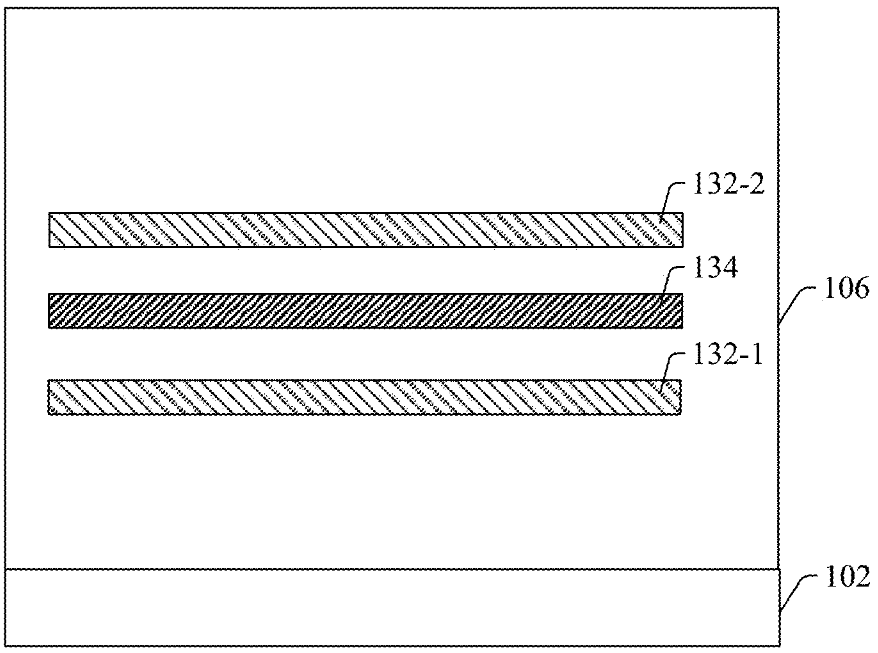
FIGS. 2-7 illustrate a series of cross-sectional views of some embodiments of a method of forming a memory device with stackable memory cells.

As shown in FIG. 2, in some embodiments, a stack of source/drain precursor layers 132 (e.g. 132-1, 132-2) and a gate precursor layer 134 are formed over a substrate 102 within an ILD layer 106. The substrate 102 may be any type of substrate, such as comprising a semiconductor body and/or epitaxial layers, e.g., silicon, SiGe, silicon-on-insulator (SOI), or the like. In some embodiments, FEOL devices, such as logic devices, plugs, and one or more lower interconnects (e.g., conductive contacts, interconnect vias, and/or interconnect wires connected to the logic devices) may be formed over the substrate 102 before forming the stack of the source/drain precursor layers 132 (e.g. 132-1, 132-2) and the gate precursor layer 134. The stack of the source/drain precursor layers 132 (e.g. 132-1, 132-2) and the gate precursor layer 134 may be formed by a series of deposition processes such as chemical vapor deposition (CVD), physical vapor deposition (PVD), or other suitable deposition process. A plurality of dielectric material deposition may be performed between the forming of the source/drain precursor layers 132 (e.g. 132-1, 132-2) and the gate precursor layer 134 to form the ILD layer 106. The source/drain precursor layers 132 (e.g. 132-1, 132-2) and the gate precursor layer 134 are of different metal or other conductive materials. For example, the source/drain precursor layers 132 (e.g. 132-1, 132-2) may be or be comprised of a first metal material, such as titanium nitride (TiN), while the gate precursor layer 134 may be or be comprised of a second metal material, such as Nickle (Ni). Other candidate material for the source/drain precursor layers 132 (e.g. 132-1, 132-2) or the gate precursor layer 134 may include, for example, one of tungsten (W), copper (Cu), ruthenium (Ru), cobalt (Co), heavily doped silicon, a combination of the foregoing, or the like. The first metal material and the second metal material may be selected such that an etching selectivity is high (e.g., 10:1 or higher) such that one metal is etched preferentially over the other during a subsequent process of recessing the gate precursor layer 134. Alternatively, the source/drain precursor layers 132 (e.g. 132-1, 132-2) and the gate precursor layer 134 are of semiconducting or non-conductive or materials with high etching selectivity, such that the gate precursor layer 134 can be selectively recessed for forming gate dielectric, floating gate, and/or other structures. For example, gate precursor layer 134 may be formed of silicon germanium, while the source/drain precursor layers 132 may be formed of silicon, or vice versa.

Figure 3:
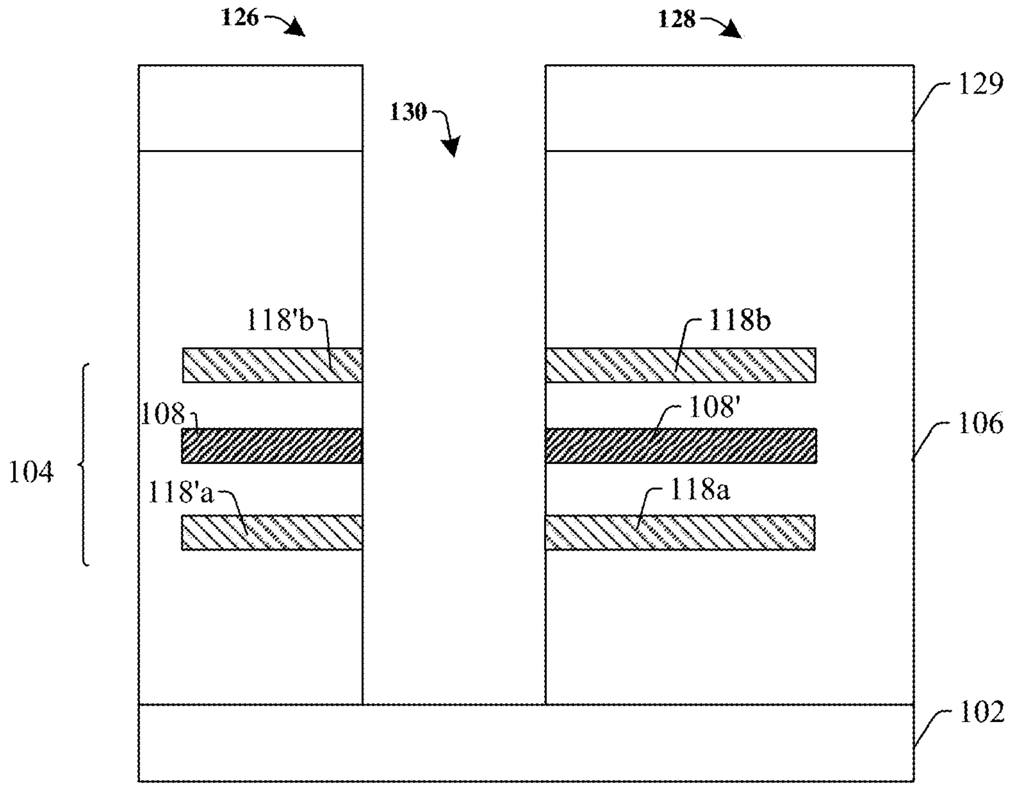

As shown in FIG. 3, in some embodiments, a vertical trench 130 is formed through the ILD layer 106 and laterally separating the stack of the source/drain precursor layers 132 (e.g. 132-1, 132-2) and the gate precursor layer 134 to form a control gate 108 and a pair of dummy source/drain terminals **118'*a*, 118'*b* on a first side 126 and a dummy control gate 108' and pair of source/drain terminals 118*a*, 118*b* on a second side 128. The vertical trench 130 may be performed by a series of etching processes with a mask 129** in place. Though not shown in the figure, an etch stop layer may be formed over the FEOL devices or one or more lower interconnects, such that the series of etching processes can be stop on the etch stop layer.

Figure 4:
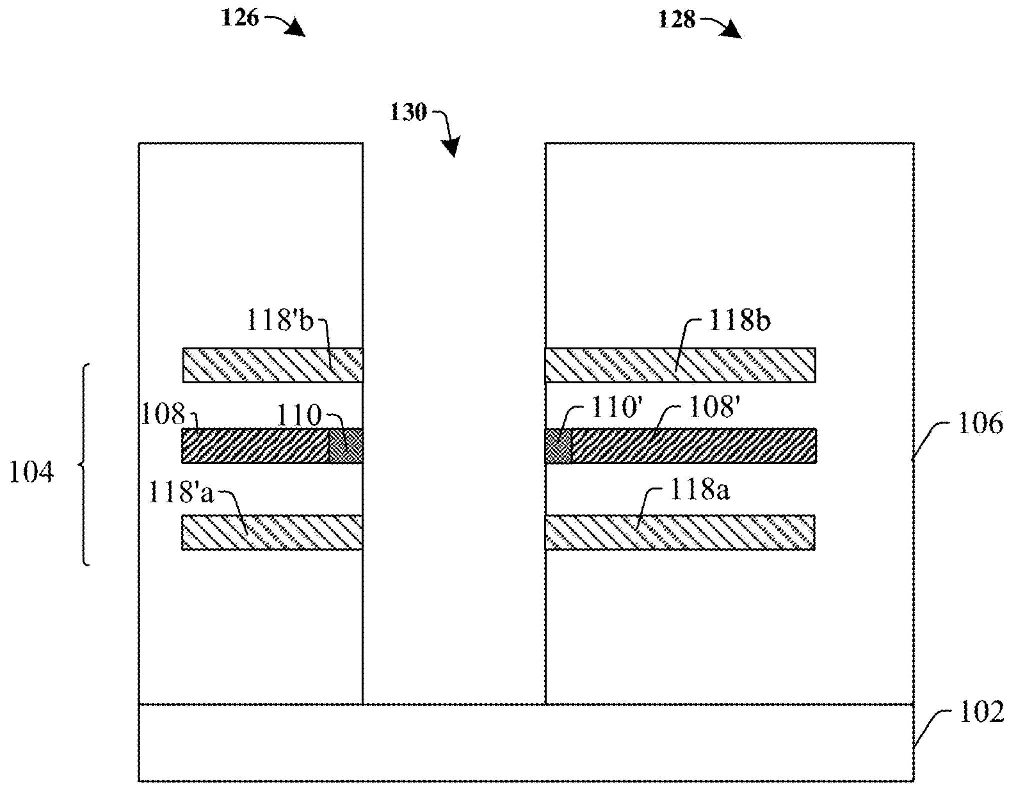

As shown in FIG. 4, in some embodiments, a tunnel dielectric 110 is formed on the first side 126 contacting the control gate 108. In some embodiments, a dummy tunnel dielectric 110' is also formed on the second side 128 contacting the dummy control gate 108'. The tunnel dielectric 110 and the dummy tunnel dielectric 110' may be formed of silicon nitride for example, or other suitable dielectric material. The tunnel dielectric 110 and the dummy tunnel dielectric 110' may be formed by firstly performing an etch to form recesses on the control gate 108, forming a tunnel dielectric precursor, and performing an etch to remove excess portions of the tunnel dielectric precursor and leave the tunnel dielectric 110 and the dummy tunnel dielectric 110' in place.

Figure 5:
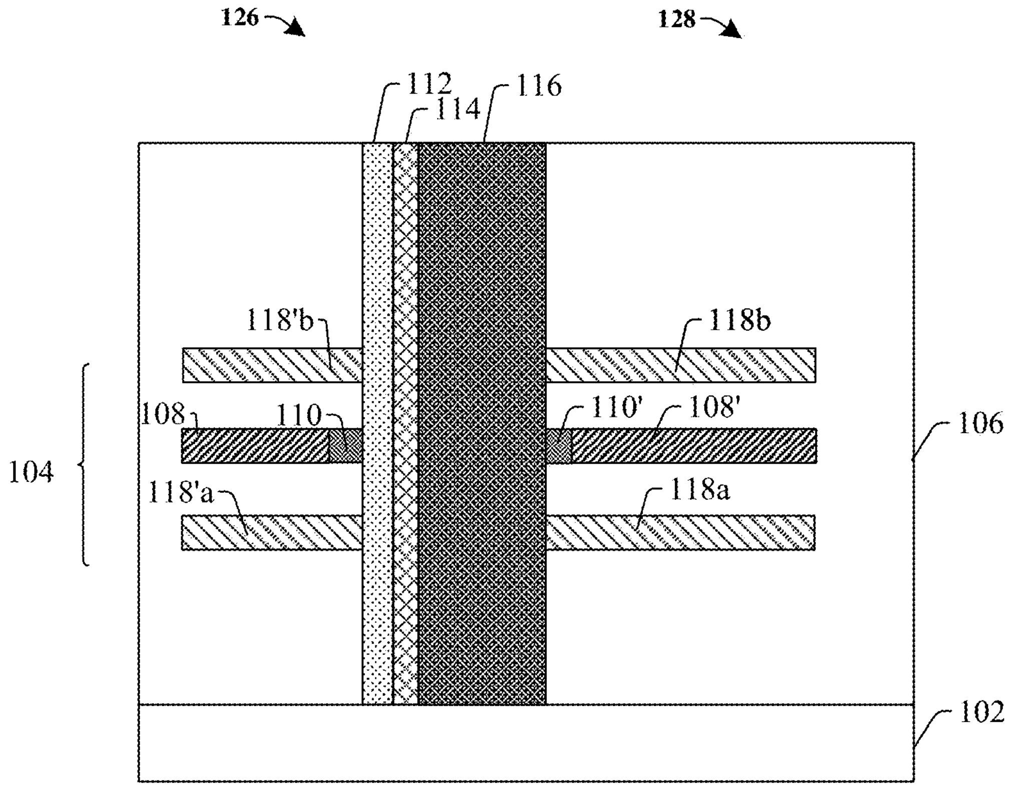

As shown in FIG. 5, in some embodiments, a floating gate 112, a gate dielectric 114, and a channel layer 116 are formed within the vertical trench. The floating gate 112, the gate dielectric 114, and the channel layer 116 may be formed by a series of deposition processes respectively filling the vertical trench 130 and then partially removed by vertical etching processes.

Figure 6:
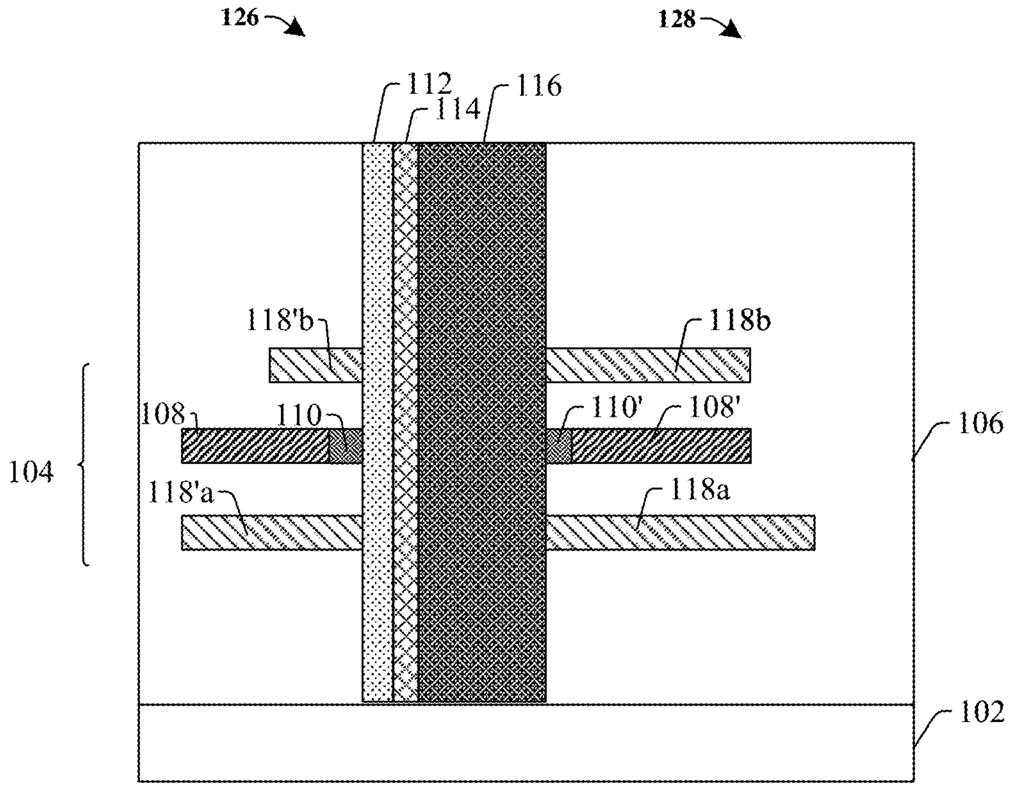

As shown in FIG. 6, in some embodiments, a "staircase" structure is formed to prepare for forming gate contact and source/drain contacts. As an example, on the first side 126, the upper dummy source/drain terminal **118'*b* may be etched to be shortened such that an upper surface of the control gate 108 can be exposed to a contact trench. Similarly, on the second side 128, the upper source/drain terminal 118*b* and the dummy control gate 108' can may be etched to be shortened such that an upper surface of the lower source/drain terminal 118*a*** can be exposed to a contact trench.

Figure 7:
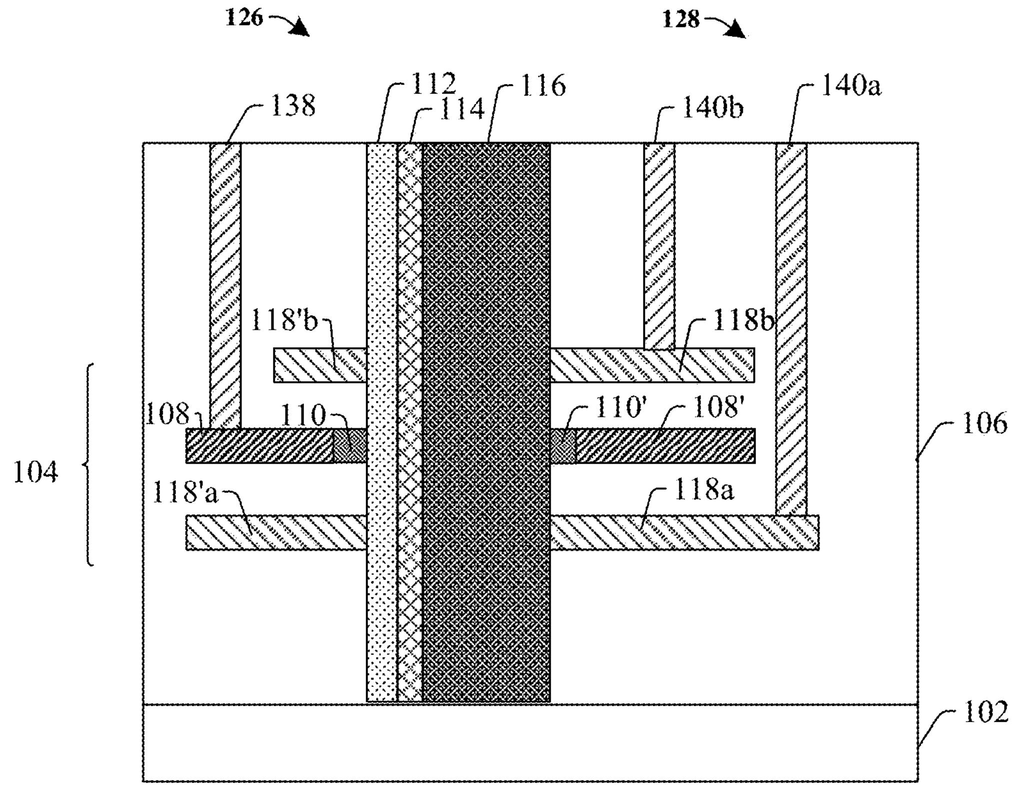

As shown in FIG. 7, in some embodiments, a gate contact 138 is formed through the ILD layer 106 and reaching on the upper surface of the control gate 108. Source/drain contacts **140*a*, 140*b* are formed through the ILD layer 106 and respectively reaching on the upper surface of the lower source/drain terminal 118***a* and the upper source/drain terminal 118*b*.

Figure 8:
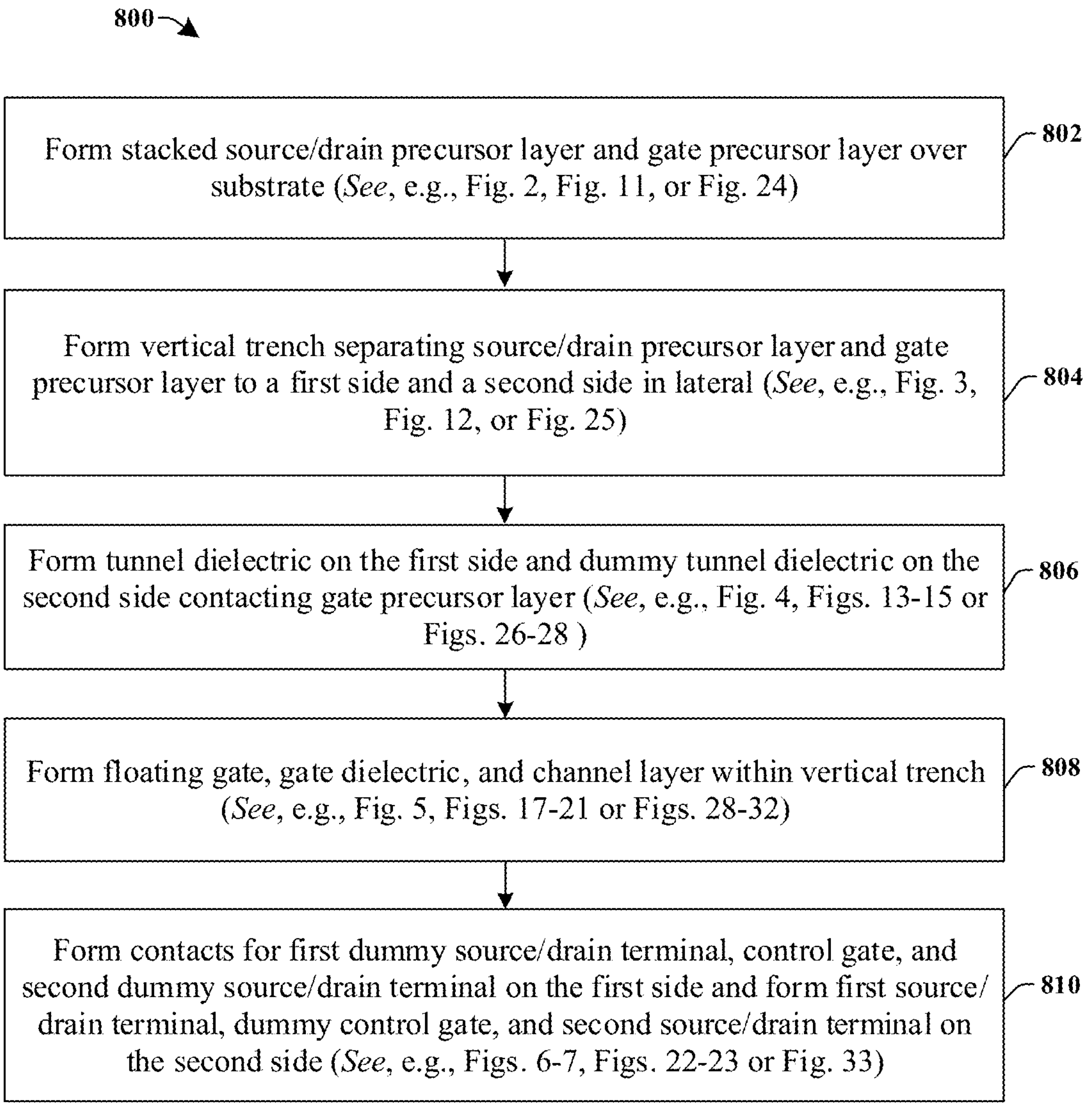
FIG. 8 illustrates a flow diagram of some embodiments of a method of forming a memory device with stackable memory cells.

FIG. 8 illustrates a method 800 of forming a BEOL memory cell in accordance with some embodiments. Although this method and other methods illustrated and/or described herein are illustrated as a series of acts or events, it will be appreciated that the present disclosure is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 802, in some embodiments, a stack of source/drain precursor and gate precursor layers are formed over a substrate. FIG. 2 provides an example of forming a stack of source/drain precursor and gate precursor layers. In addition, FIG. 11 and FIG. 24 below also provide additional examples of forming a stack of source/drain precursor and gate precursor layers for forming stacked memory cells with separated floating gates and a shared channel layer.

At act 804, in some embodiments, a vertical trench is formed through the ILD layer and laterally separating the stack of source/drain precursor and gate precursor layers to a first side and a second side. FIG. 3 provides an example of forming the vertical trench. In addition, FIG. 12 and FIG. 25 below also provide additional examples of forming a vertical trench for separating the stack of source/drain precursor and gate precursor layers for stacked memory cells with separated floating gates and a shared channel layer.

At act 806, in some embodiments, a tunnel dielectric is formed on the first side contacting gate precursor layer. In some embodiments, a dummy tunnel dielectric is also formed on the second side contacting gate precursor layer. FIG. 4 provides an example of forming the tunnel dielectric. In addition, FIGS. 13-16 and FIGS. 26-28 below also provide additional examples of forming tunnel dielectrics for stacked memory cells with separated floating gates and a shared channel layer.

At act 808, in some embodiments, a floating gate, a gate dielectric, and a channel layer are formed within the vertical trench. FIG. 5 provides an example of forming the floating gate, the gate dielectric, and the channel layer within the vertical trench. In addition, FIGS. 17-21 and FIGS. 29-32 below also provide additional examples of forming separated floating gates and a shared channel layer for stacked memory cells.

At act 810, in some embodiments, contacts and interconnect are formed for the control gate and the source/drain terminals. A "staircase" structure may be formed for the control gate, the source/drain terminals, and/or corresponding dummy structures, such that a gate contact can be formed reaching on the control gate, and source/drain contacts can be formed reaching on the source/drain terminals. FIGS. 6-7 provide an example of exposing upper surfaces of the control gate and the source/drain terminals and forming contacts thereon, respectively. In addition, FIGS. 22-23 and FIG. 33 below also provide additional examples of forming contacts for control gates and source/drain terminals of the stacked memory cells.

Figure 9:
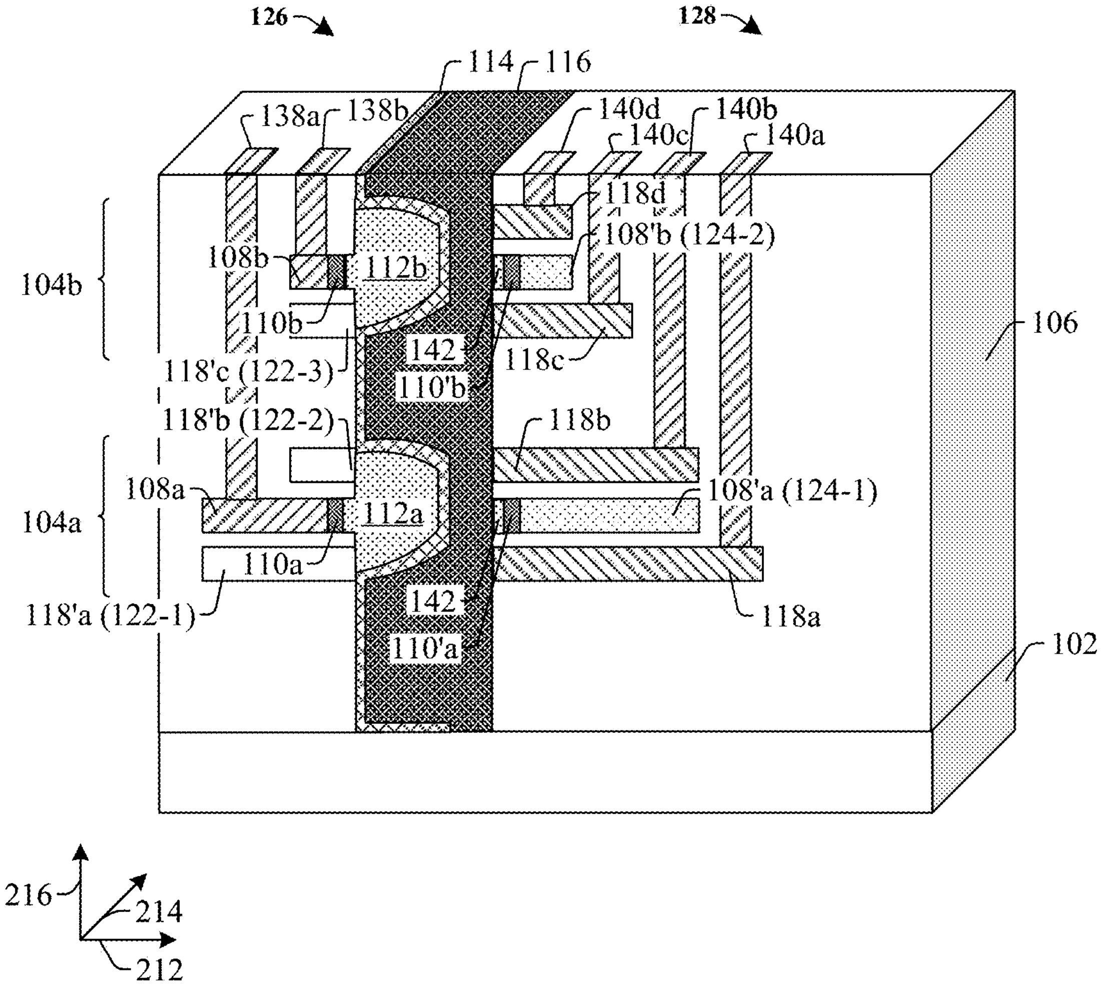
FIG. 9 illustrates a 3D view of some further embodiments of a memory device with stacked memory cells.
Figure 10:
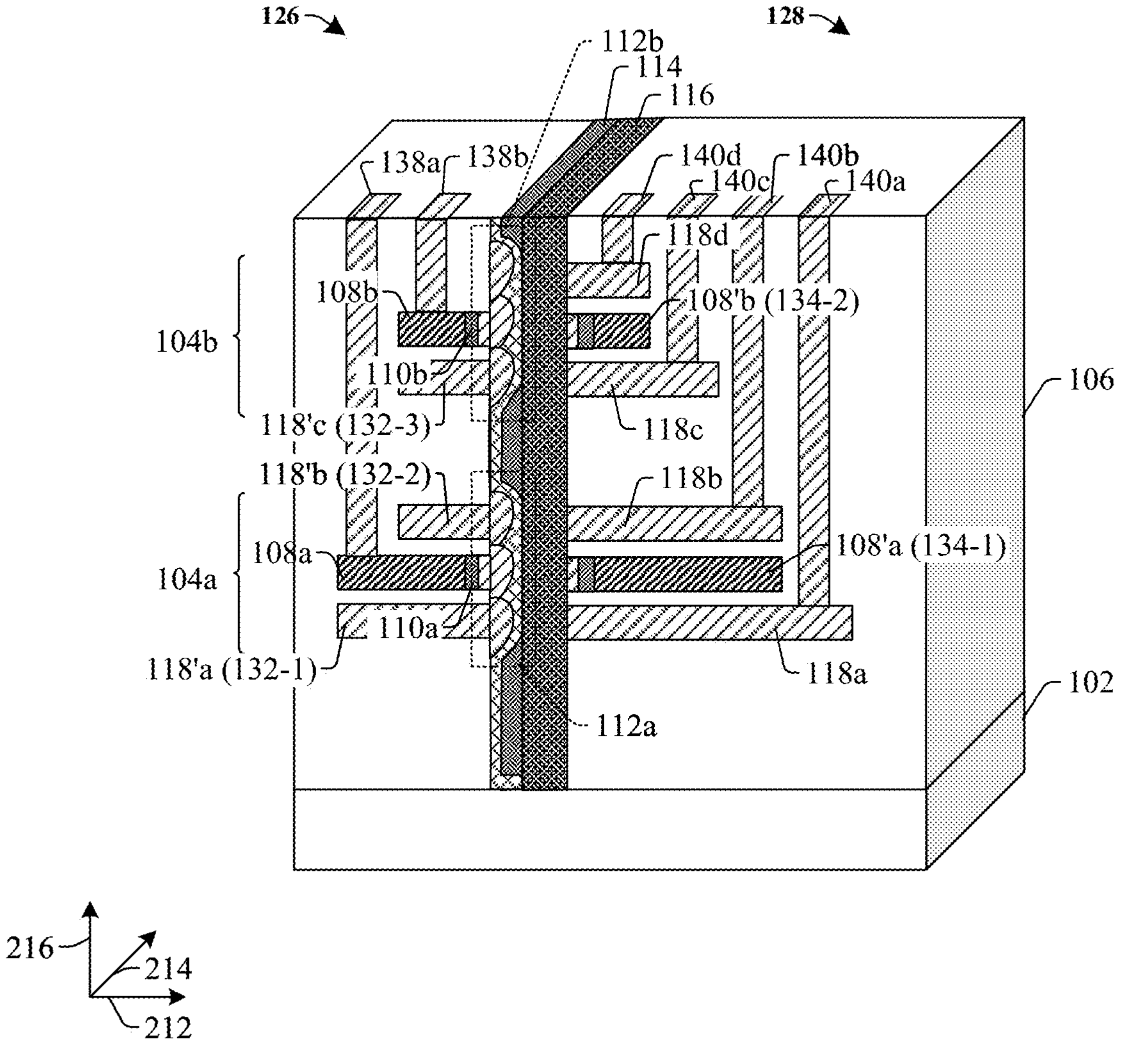
FIG. 10 illustrates a 3D view of some additional embodiments of a memory device with stacked memory cells.

FIG. 9 and FIG. 10 respectively shows a 3D view of some further embodiments of a memory device with stacked memory cells. A number of memory cells, such as the memory cell 104 as described above associated with FIGS. 1-7, can be stacked one over another on the substrate 102. In some embodiments, the stacked memory cells may have respective control gate and source/drain terminals disposed on opposite sides of a shared channel layer, and may have floating gates separated from the shared channel layer by a shared gate dielectric. As described in more details below, in some embodiments, the floating gates respectively extends from a recess of a control gate and separated from the control gate by a tunnel dielectric. For simplicity purpose, a first memory cell 104*a* and a second memory cell 104*b* are illustrated in FIG. 9 and FIG. 10 as well as other subsequent figures, while more similar memory cells can be stacked to achieve a scaled down memory device with greater cell density.

As shown in FIG. 9, in some embodiments, the channel layer 116 extends along the vertical direction 216. A gate dielectric 114 is disposed on one side of the channel layer 116 and extended along a first sidewall of the channel layer 116. In some embodiments, the gate dielectric 114 may further extend to a bottom surface of the channel layer 116. The gate dielectric 114 may cover a portion of the bottom surface of the channel layer 116 as shown in FIG. 9. Alternatively, the gate dielectric 114 may cover the entire bottom surface of the channel layer 116. The gate dielectric 114 may be a conformal liner. The gate dielectric 114 may be or be comprised of silicon oxide, for example.

In some embodiments, a first floating gate 112*a* of the first memory cell 104*a* and a second floating gate 112*b* of the second memory cell 104*b* are disposed next to the gate dielectric 114 and separated from the channel layer 116 by the gate dielectric 114. The second floating gate 112*b* may be stacked over and spaced from the first floating gate 112*a*. In some embodiments, the first floating gate 112*a* and the second floating gate 112*b* respectively is or is comprised of a bumped shaped conductive component with a convex sidewall contacting the gate dielectric 114. In some embodiments, the gate dielectric 114 comprises first and second portions respectively lining and contacting the convex sidewall of the first and second floating gates 112*a*, 112*b*, and connected by a middle portion disposed between the first floating gate 112*a* and the second floating gate 112*b*. The middle portion may be or be comprised of a first sidewall vertically aligned with first sidewalls of the first floating gate 112*a* and the second floating gate 112*b*. The first sidewalls of the first floating gate 112*a* and the second floating gate 112*b* may be or be comprised of planar portions directing contacting a vertical sidewall of the ILD layer 106.

In some embodiments, a first control gate 108*a* is disposed on one side, for example, a first side 126, of the first floating gate 112*a* opposite to the channel layer 116 and separated from the first floating gate 112*a* by a first tunnel dielectric 110*a*. A second control gate 108*b* is disposed on one side, for example, the first side 126, of the second floating gate 112*b* opposite to the channel layer 116 and separated from the second floating gate 112*b* by a second tunnel dielectric 110*b*. The first floating gate 112*a* and the second floating gate 112*b* may respectively comprise a straight sidewall contacting the first tunnel dielectric 110*a* and the second tunnel dielectric 110*b*. In some embodiments, the first floating gate 112*a* and the second floating gate 112*b* respectively comprises a protrusion extended from the first sidewall toward the first tunnel dielectric 110*a* and the second tunnel dielectric 110*b*. The protrusion of the first floating gate 112*a*, the first tunnel dielectric 110*a*, and the first control gate 108*a* may have co-planar upper and bottom surfaces and coplanar sidewall surfaces along the first lateral direction 212. The protrusion of the first floating gate 112*a*, the first tunnel dielectric 110*a*, and the first control gate 108*a* may also have equal dimensions along the second lateral direction 214 and the vertical direction 216. Similarly, the protrusion of the second floating gate 112*b*, the second tunnel dielectric 110*b*, and the second control gate 108*b* may have co-planar upper and bottom surfaces and coplanar sidewall surfaces along the first lateral direction 212 and may also have equal dimensions along the second lateral direction 214 and the vertical direction 216.

In some embodiments, a first pair of source/drain terminals 118*a*, 118*b* is disposed on the other side, for example, a second side 128, of the channel layer 116 opposite to the first floating gate 112*a*. A second pair of source/drain terminals 118*c*, 118*d* is disposed on the other side, for example, the second side 128, of the channel layer 116 opposite to the second floating gate 112*b*. In some embodiments, a first dummy control gate 108'*a* and a second dummy control gate 108'*b* may be disposed on the second side 128 respectively between the first pair of source/drain terminals 118*a*, 118*b* and the second pair of source/drain terminals 118*c*, 118*d*. A first dummy tunnel dielectric 110'*a* may be disposed on the second side 128 between the first dummy control gate 108'*a* and the channel layer 116. Similarly, a second dummy tunnel dielectric 110'*b* may be disposed on the second side 128 between the second dummy control gate 108'*b* and the channel layer 116. In some further embodiments, floating gate residues 142 may be disposed between the channel layer 116 and the dummy tunnel dielectrics 110'*a*, 110'*b*. The floating gate residues 142, the dummy tunnel dielectrics 110'*a*, 110'*b*, and the dummy control gates 108'*a*, 108'*b* may correspondingly have co-planar upper and bottom surfaces and coplanar sidewall surfaces along the first lateral direction 212, and may also have equal dimensions along the second lateral direction 214 and the vertical direction 216.

In some embodiments, a first gate contact 138*a* is disposed on an upper surface of the first control gate 108*a* on the first side 126. A first pair of source/drain contacts 140*a*, 140*b* is disposed on an upper surface of a first pair of source/drain terminals 118*a*, 118*b* on the second side 128. Similarly, a second gate contact 138*b* is disposed on an upper surface of the second control gate 108*b* on the first side 126. A second pair of source/drain contacts 140*c*, 140*d* is disposed on an upper surface of a second pair of source/drain terminals 118*c*, 118*d* on the second side 128. The gate contacts 138*a*, 138*b* and the source/drain contacts 140*a-d* are laterally shifted from one another and extended upwardly along the vertical direction 216. In some embodiments, gate contacts 138*a*, 138*b* and the source/drain contacts 140*a-d* are shifted in the first lateral direction 212, the second lateral direction 214, or both the first lateral direction 212 and the second lateral direction 214. In some embodiments, the gate contacts 138*a*, 138*b* and the source/drain contacts 140*a-d* may be extended and coupled to interconnect wires of one single metal layer. In other embodiments, one or more of the gate contacts 138*a*, 138*b* and the source/drain contacts 140*a-d* may be extended and coupled to interconnect wires of different metal layers for a more flexible wire routing.

In some embodiments, a first dummy control gate 108'*a* may be disposed on the second side 128 and vertically between the first pair of source/drain terminals 118*a*, 118*b*. A second dummy control gate 108'*b* may be disposed on the second side 128 and vertically between the second pair of source/drain terminals 118*c*. 118*d*. A first pair of dummy source/drain terminals 118'*a*, 118'*b* may be disposed on the first side 126 and vertically separated by the first control gate 108*a*. In some embodiments, An additional dummy source/drain terminal 118'*c* may be disposed on the first side 126 below the second control gate 108*b*, while another dummy source/drain terminal may or may not present above the second control gate 108*b*, such that the second gate contact 138*b* can be more flexibly arranged to reach on the second control gate 108*b*.

In some embodiments, the dummy control gates 108'*a*, 108'*b* and the pairs of dummy source/drain terminals 118'*a-c* are of different materials. For example, the pairs of dummy source/drain terminals 118'*a-c* may be or be comprised of a first set of semiconductor layers 122-1, 122-2, 122-3 of a first semiconductor material such as silicon. The dummy control gates 108'*a-b* may be or be comprised of a second set of semiconductor layers 124-1, 124-2, of a second semiconductor material such as silicon germanium, or vice versa.

As shown in FIG. 10, in some embodiments, in addition to features described associated with FIG. 9, the pair of dummy source/drain terminals 118'*a-c* may be or be comprised of a set of source/drain precursor layers 132-1, 132-2, 132-3 of a first conductive material same as the source/drain terminals 118*a-d*, such as titanium nitride (TiN). The dummy control gates 108'*a*, 108'*b* may be or be comprised of a set of gate precursor layers 134-1, 134-2 of a second conductive material same as the control gate 108, such as nickel (Ni). In some embodiments, the floating gates 112*a*, 112*b* may respectively comprises three consecutive bumps with a middle one contacting the tunnel dielectric 110*a*, 110*b*. Some of the bumps may contact the set of source/drain precursor layers 132-1, 132-2, and 132-3. By forming the floating gates 112*a*, 112*b* vertically extended beyond the tunnel dielectric 110 and even beyond the source/drain precursor layers 132-1, 132-2, 132-3, i.e., dummy source/drain terminals 118'*a*, 118'*b* to be formed, the volume of the floating gates 112*a*. 112*b* is enlarged, and more carriers can be saved in the floating gates 112*a*, 112*b*.

FIGS. 11-23 illustrate a series of 3D views of some further embodiments of a method of forming a memory device with stacked memory cells 104*a*, 104*b*. Although FIGS. 11-23 are described as a series of acts that corresponds to form a memory device similar to the memory device described in FIG. 9, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 11:
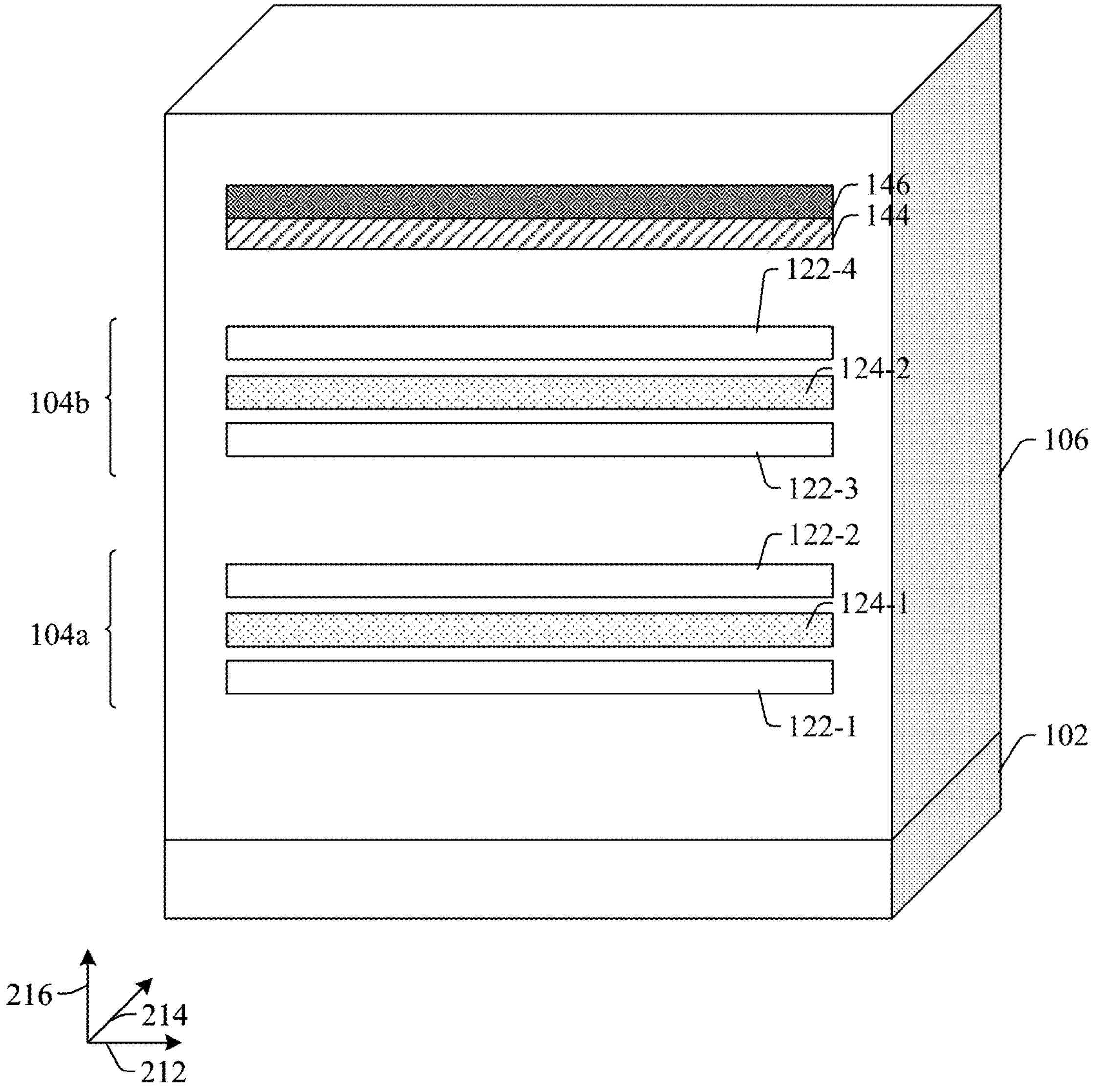
FIGS. 11-23 illustrate a series of 3D views of some further embodiments of a method of forming a memory device with stackable memory cells.

As shown in FIG. 11, in some embodiments, a first set of semiconductor layers 122 (e.g., 122-1, 122-2, 122-3, 122-4) and a second set of semiconductor layers 124 (e.g., 124-1, 124-2) are formed over a substrate 102 within an ILD layer 106. The substrate 102 may be any type of substrate, such as comprising a semiconductor body and/or epitaxial layers, e.g., silicon, SiGe, silicon-on-insulator (SOI), or the like. In some embodiments, FEOL devices, such as logic devices, plugs, and one or more lower interconnects (e.g., conductive contacts, interconnect vias, and/or interconnect wires connected to the logic devices) may be formed over the substrate 102 before forming the first set of semiconductor layers 122 and the second set of semiconductor layers 124. The semiconductor layers 122, 124 may be formed by a series of deposition processes such as chemical vapor deposition (CVD), physical vapor deposition (PVD), or other suitable deposition process. A plurality of dielectric material deposition may be performed between the forming of the semiconductor layers 122, 124 to form the ILD layer 106. In some embodiments, the first set semiconductor layers 122 and the second set of semiconductor layers 124 are of different semiconductor materials with high etching selectivity, such that the second set of semiconductor layers 124 can be selectively recessed for forming gate dielectric, floating gate, and/or other structures subsequently. For example, the second set of semiconductor layers 124 may be formed of silicon germanium, while the first set of semiconductor layers 122 may be formed of silicon, or vice versa. In some embodiments, one or more mask layers may be formed overlying the semiconductor layers 122, 124 for patterning. For example, a first masking layer 144 of metal and a second masking layer 146 of dielectric may be subsequently deposited. The first masking layer 144 may be or be comprised of TiN for example. The second masking layer 146 may be or be comprised of SiN for example.

Figure 12:
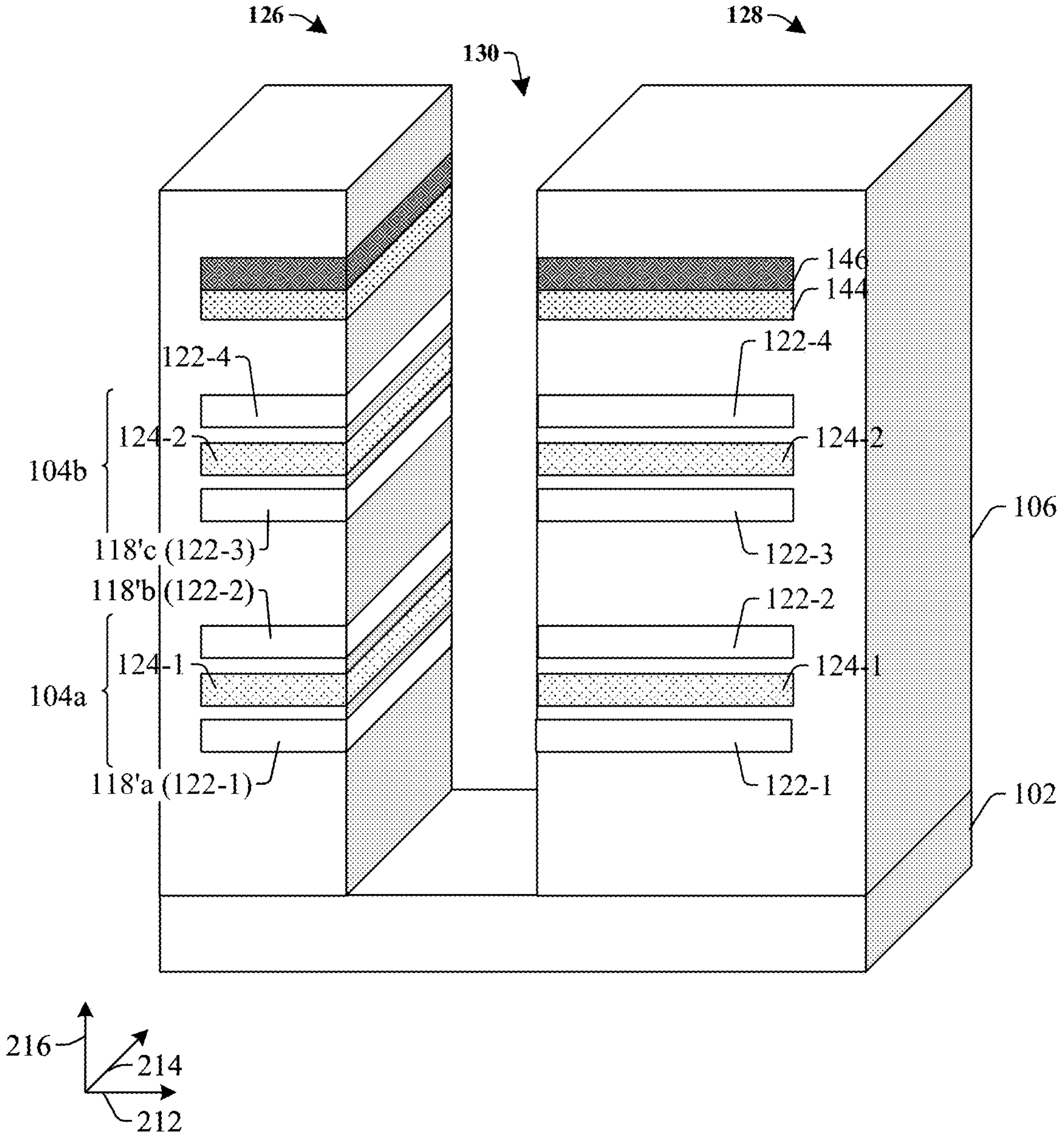

As shown in FIG. 12, in some embodiments, a vertical trench 130 is formed through the ILD layer 106 and laterally separating the semiconductor layers 122, 124 on a first side 126 and a second side 128. The vertical trench 130 may be performed by a series of etching processes with a mask in place. An etch stop layer may be formed over the FEOL devices or one or more lower interconnects, such that the series of etching processes can be stop on the etch stop layer. The etching processes may, for example, comprise a dry etching technique comprised of a plasma etch with tetrafluoromethane ($CF_4$), sulfur hexafluoride ($SF_6$), nitrogen trifluoride ($NF_3$), or the like. The etching processes may be or be comprised of and additional plasma etch with carbon tetrachloride ($CCl_4$), boron trichloride ($BCl_3$), or the like for metal etching.

Figure 13:
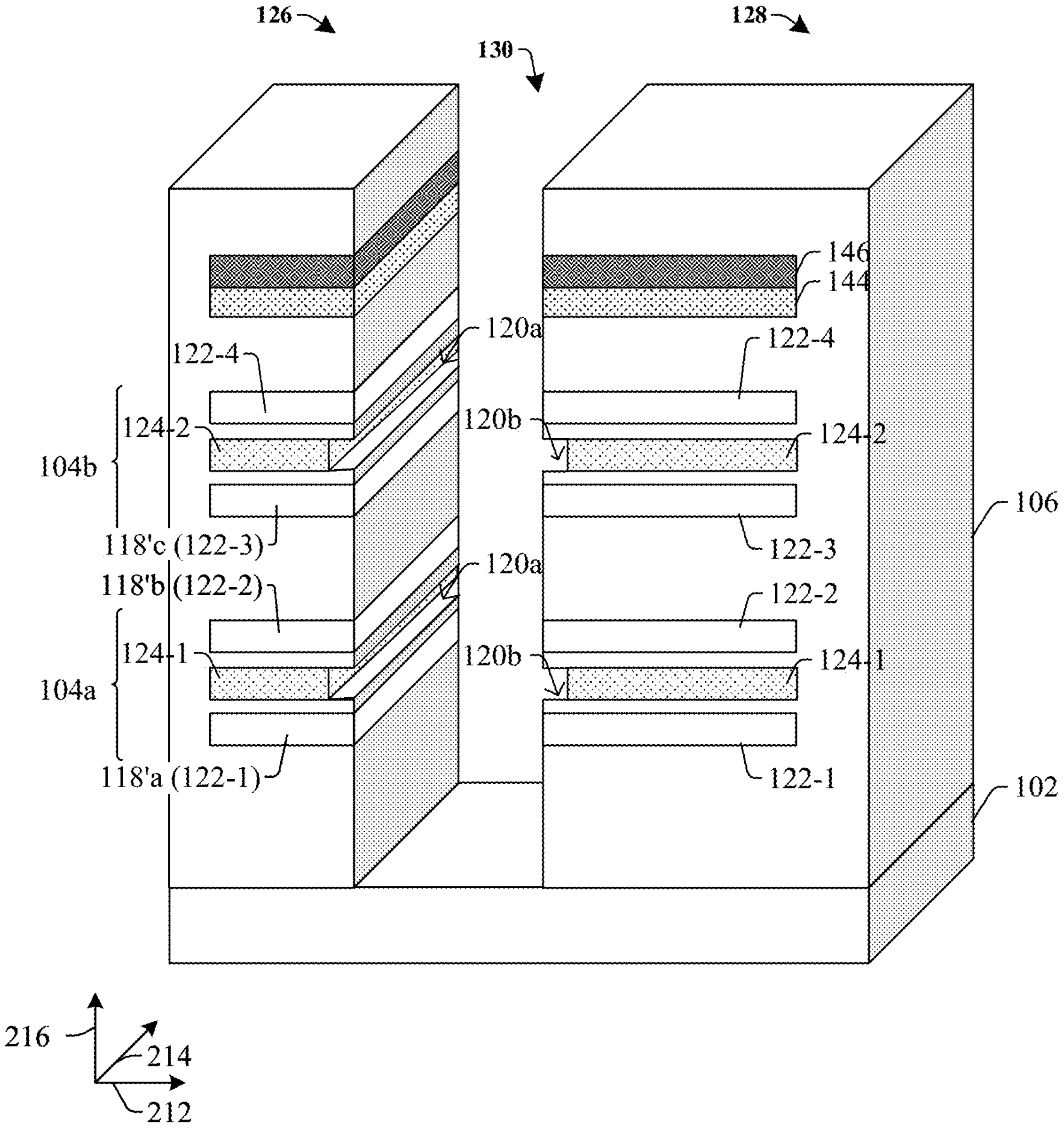
Figure 14:
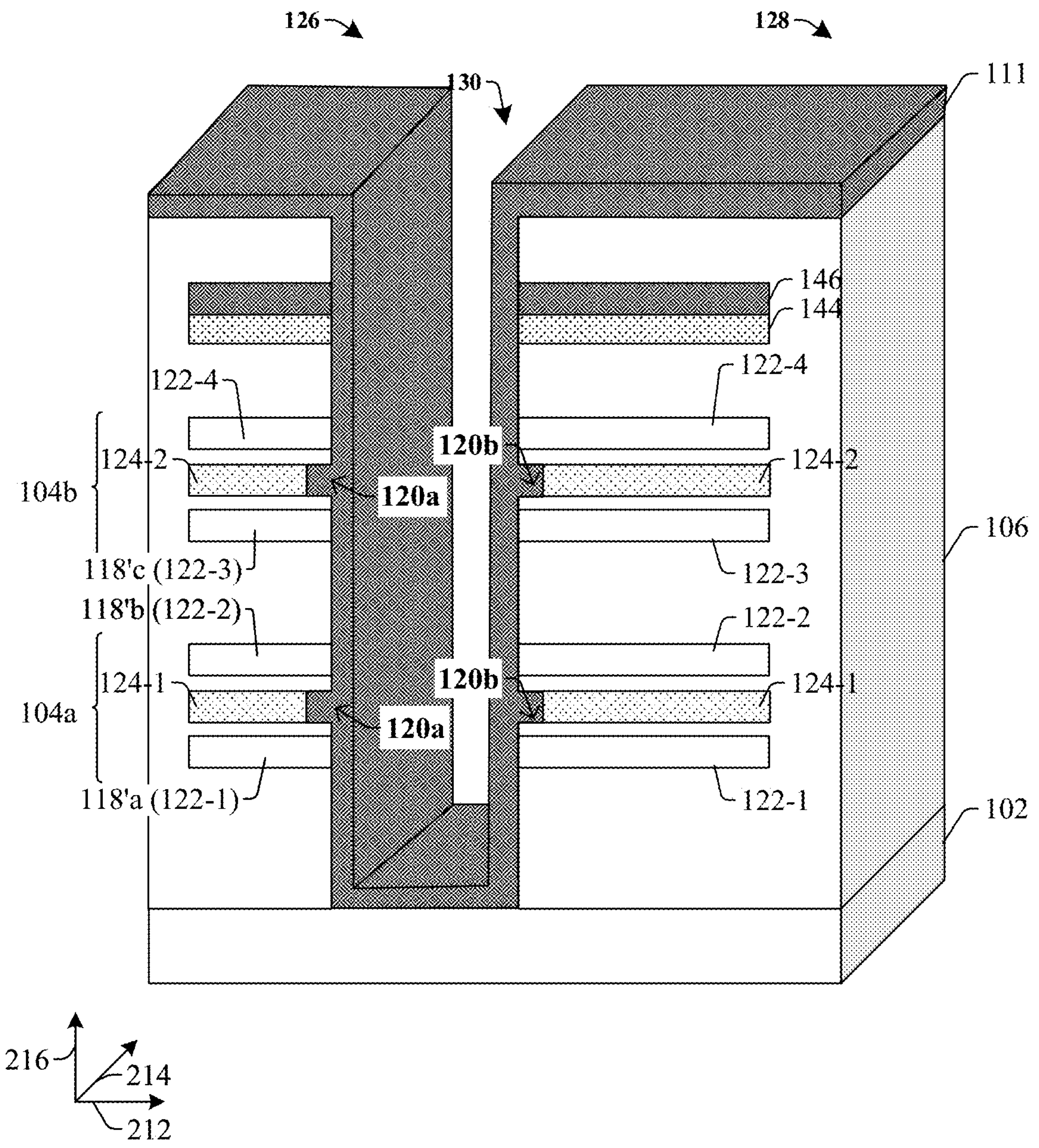
Figure 15:
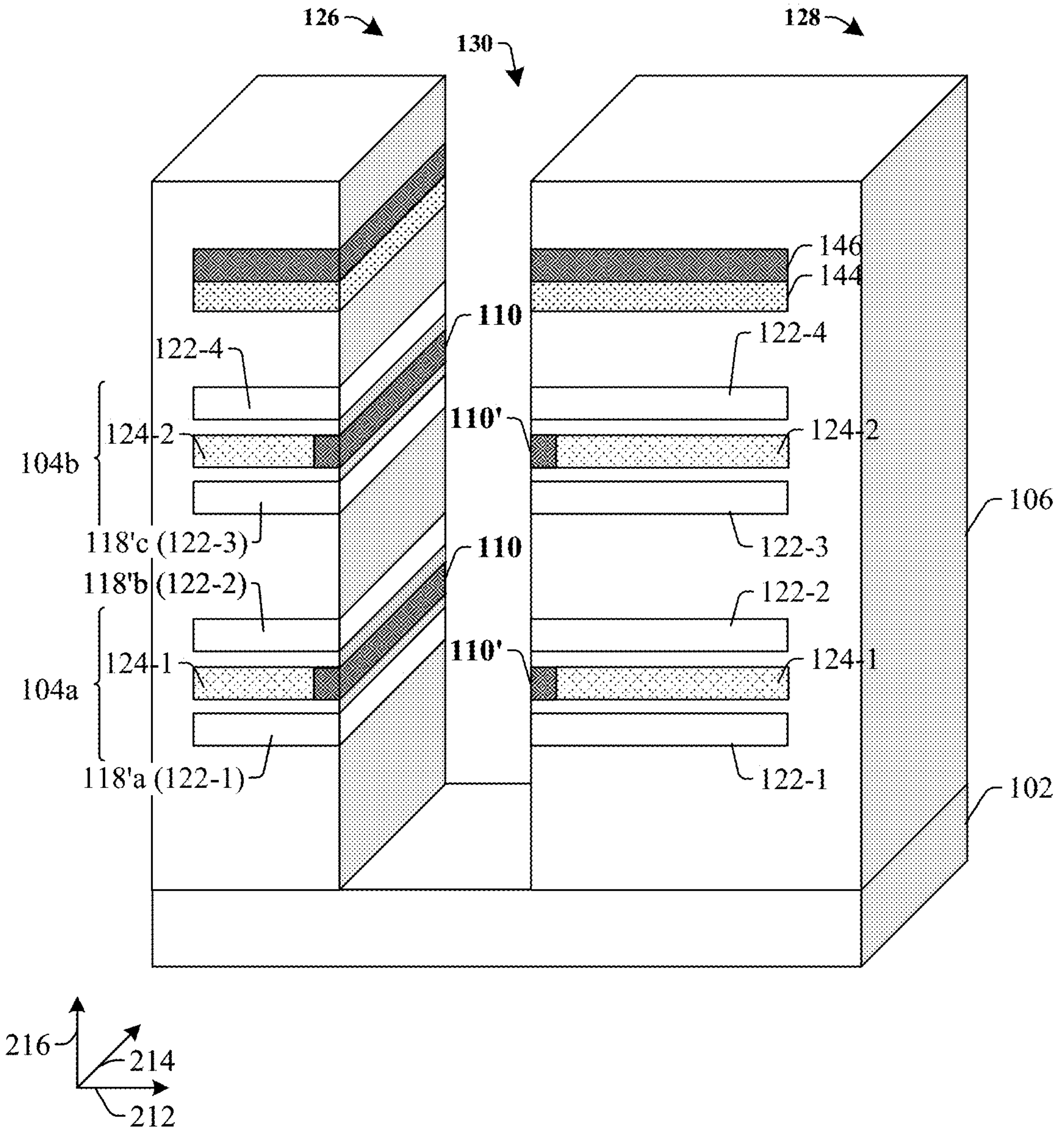
Figure 16:
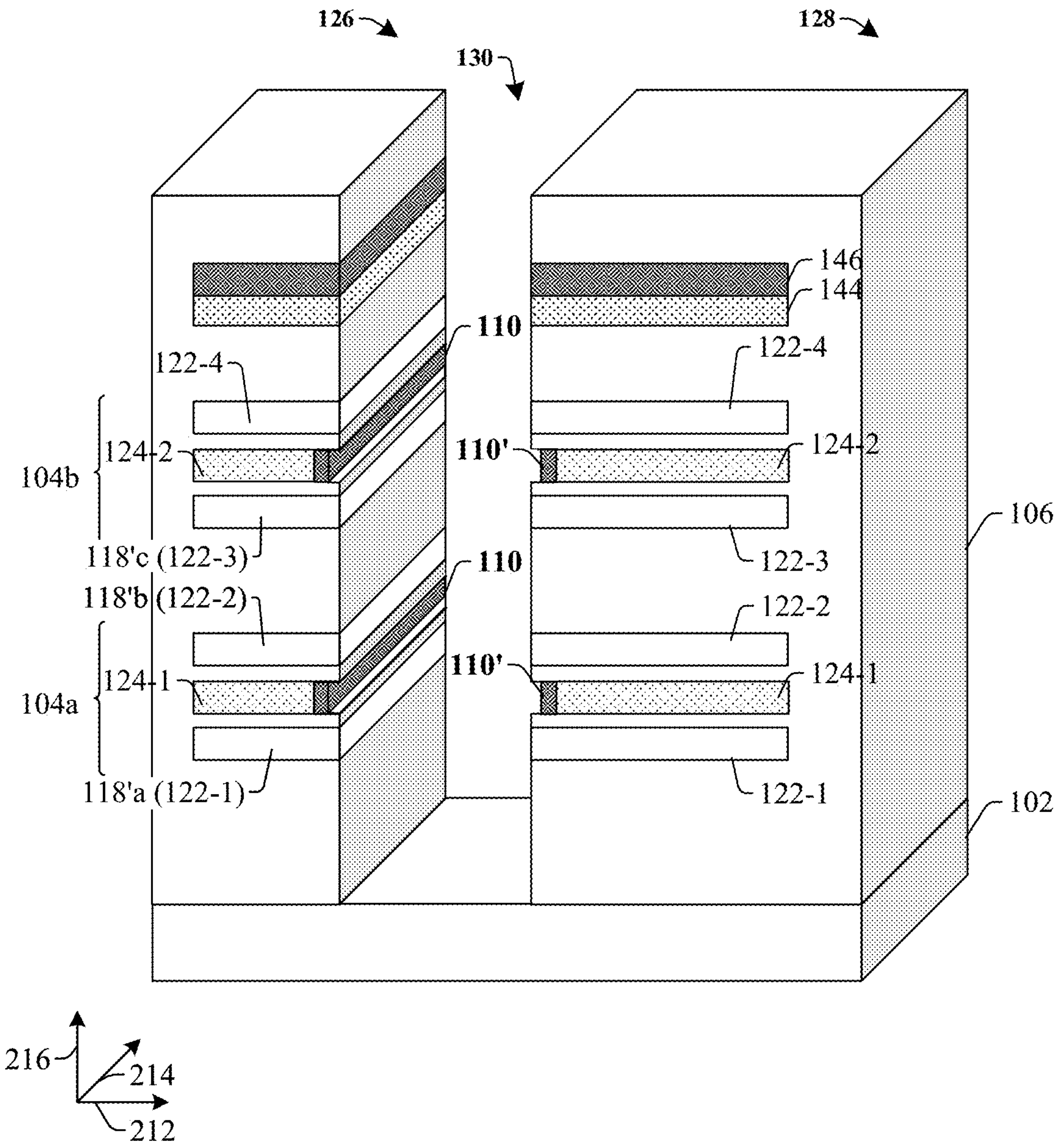

As shown in FIGS. 13-16, in some embodiments, a tunnel dielectric 110 is formed on the first side 126, and a dummy tunnel dielectric 110' is formed on the second side 128, contacting the second set of semiconductor layers 124. The tunnel dielectric 110 and the dummy tunnel dielectric 110' may be formed of silicon nitride for example, or other suitable dielectric material. As shown in FIG. 13, in some embodiments, the tunnel dielectric 110 and the dummy tunnel dielectric 110' may be formed by firstly performing an etch to form recesses 120*a*, 120*b* on the set of semiconductor layers 124. Then, as shown in FIG. 14, in some embodiments, a tunnel dielectric precursor 111 is deposited to fill the recesses 120*a*, 120*b*. The tunnel dielectric precursor 111 may be formed by conformally depositing silicon nitride on exposed surfaces of the work piece. The tunnel dielectric precursor 111 may be performed by a Low Pressure Chemical Vapor Deposition (LPCVD), for example. As shown in FIG. 15, in some embodiments, a vertical etch may be subsequently performed, removing exposed portions of the tunnel dielectric precursor 111 and retaining the portion of the tunnel dielectric precursor 111 within the recesses 120*a* on the first side 126 as the tunnel dielectric 110 and within the recesses 120*b* on the second side 128 as the dummy tunnel dielectric 110'. As shown in FIG. 16, in some embodiments, the tunnel dielectric 110 and the dummy tunnel dielectric 110' are subsequently recessed, leaving space for forming floating gates.

As shown in FIG. 17-21, in some embodiments, a floating gate 112, a gate dielectric 114, and a channel layer 116 are formed within the vertical trench 130. The floating gate 112, the gate dielectric 114, and the channel layer 116 may be formed by a series of deposition processes respectively filling the vertical trench 130 and then partially removed by vertical etching processes.

Figure 17:
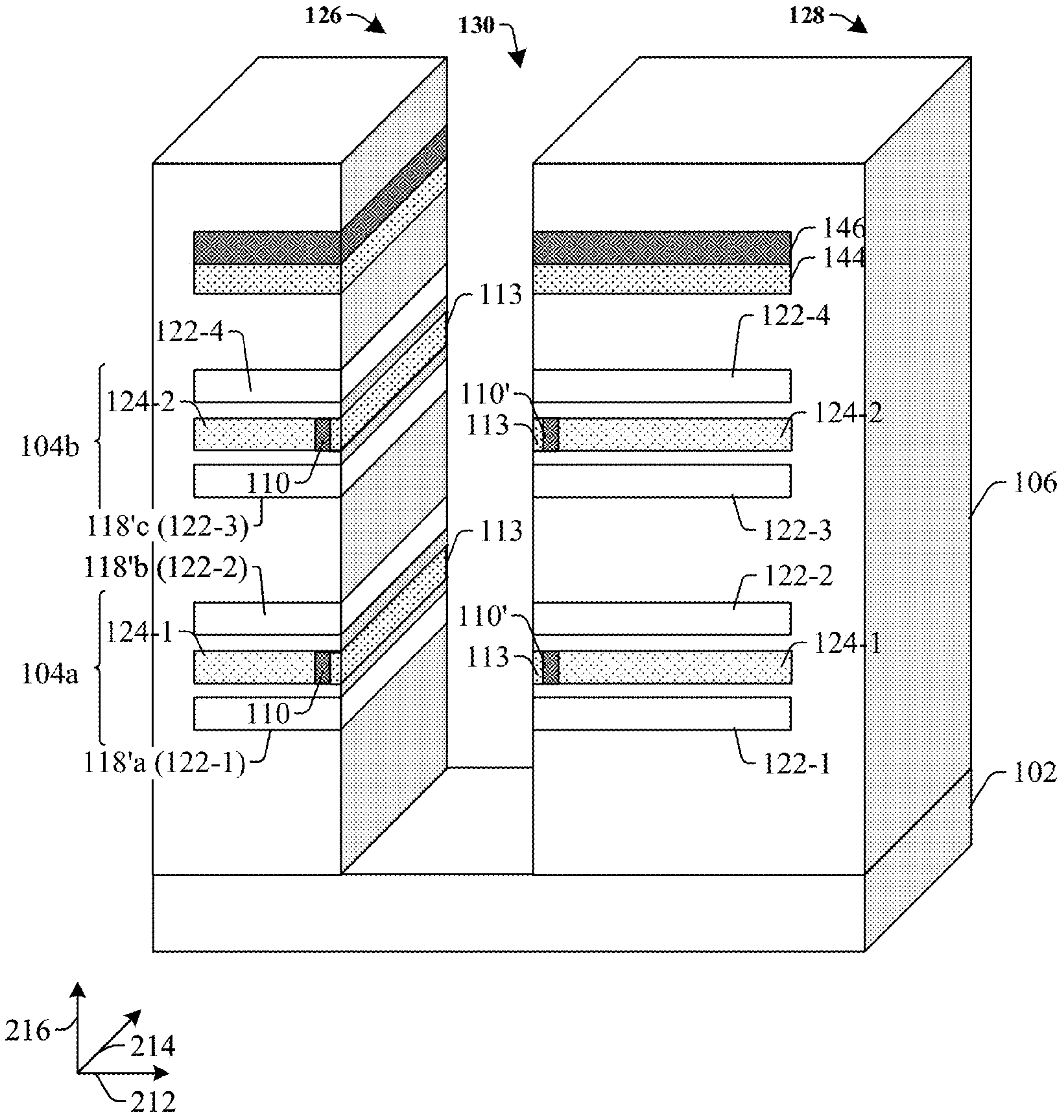
Figure 18:
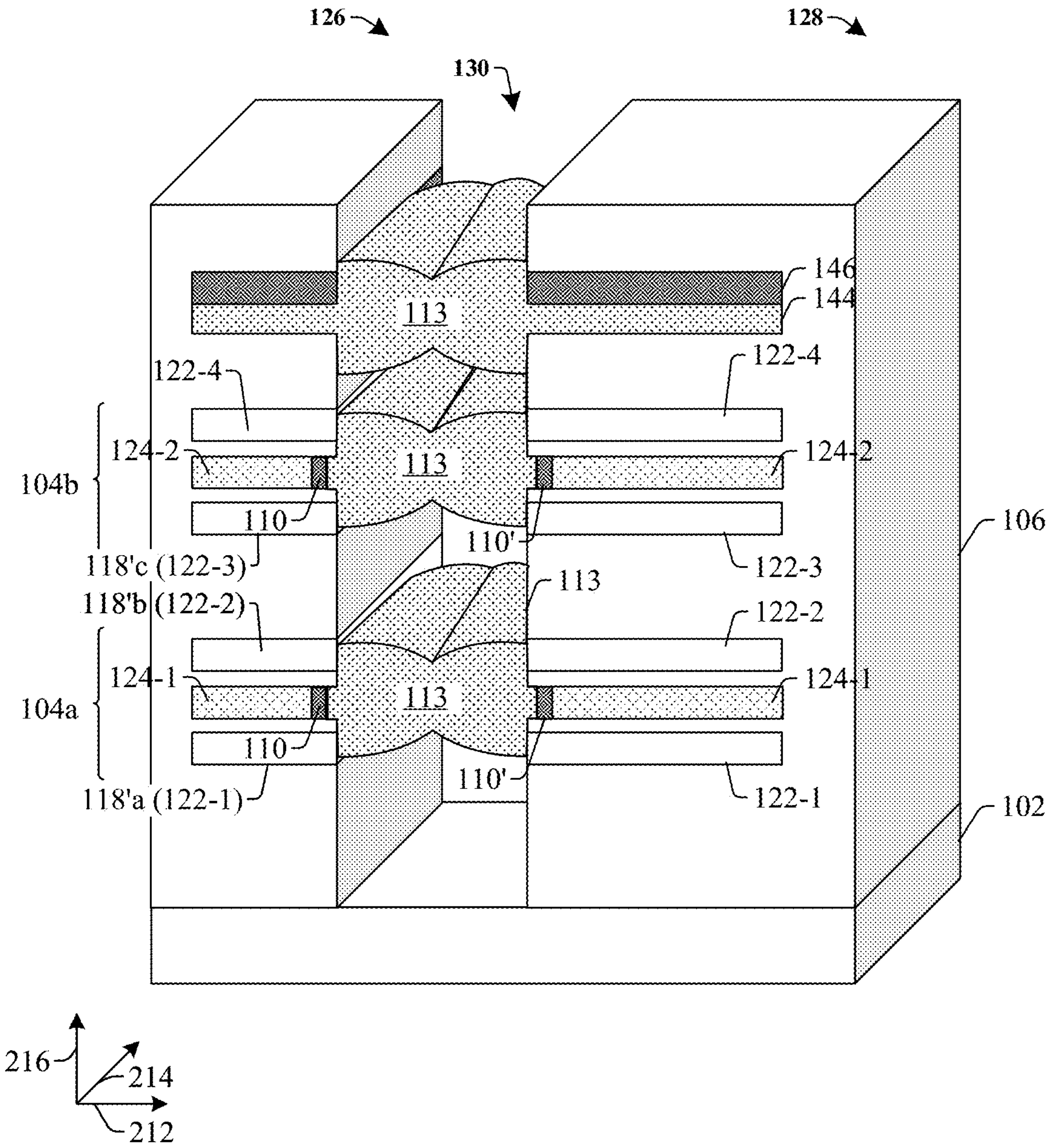
Figure 19:
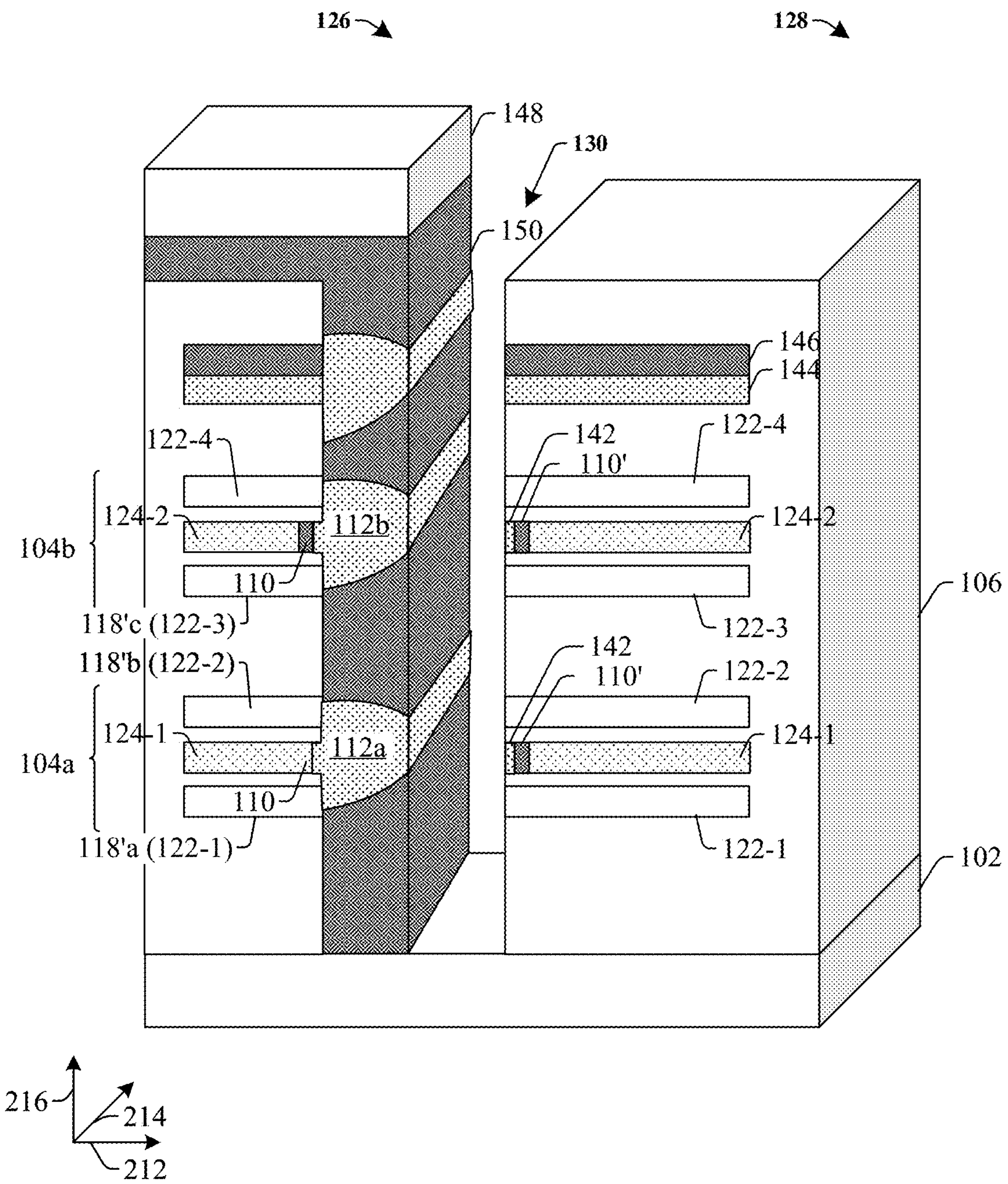

For example, as shown in FIG. 17, a floating gate precursor 113 is firstly formed within the recesses of the tunnel dielectric 110 and the dummy tunnel dielectric 110'. The floating gate precursor 113 may be formed by conformally depositing metal, such as TiN, on exposed surfaces of the work piece followed by a vertical etch to remove exposed portions and retain the portion within the recesses of the tunnel dielectric 110 and the dummy tunnel dielectric 110' as the floating gate precursor 113. As shown in FIG. 18, in some embodiments, a selective metal deposition may be performed to further extend floating gate precursors 113 as separate components for multiple memory cells 104*a*, 104*b*. The floating gate precursors 113 may be formed with curved, for example, convex-shaped surfaces within the trench 130, while sidewall surfaces contacting sidewalls of the vertical trench 130 may be straight planar. The metal material used for the floating gate precursors 113 may also be deposited on other structures such as the first masking layer 144. As shown in FIG. 19, a second filling structure 154 is formed within the trench 130 and then patterned to remove a half of the floating gate precursors 113 closer to the second side 128 and to form floating gates 112*a*, 112*b* spaced from one another. A first stack of masking layers 148 may be used to expose the half of the floating gate precursors 113 for a series of etching processes. As an example, the first stack of masking layers 148 may comprise one or more of organic material, dielectric material, and metal material. In some embodiments, floating gate residues 142 may be retained within the recesses of the dummy tunnel dielectric 110' and/or the recesses of the second set of semiconductor layers 124.

Figure 20:
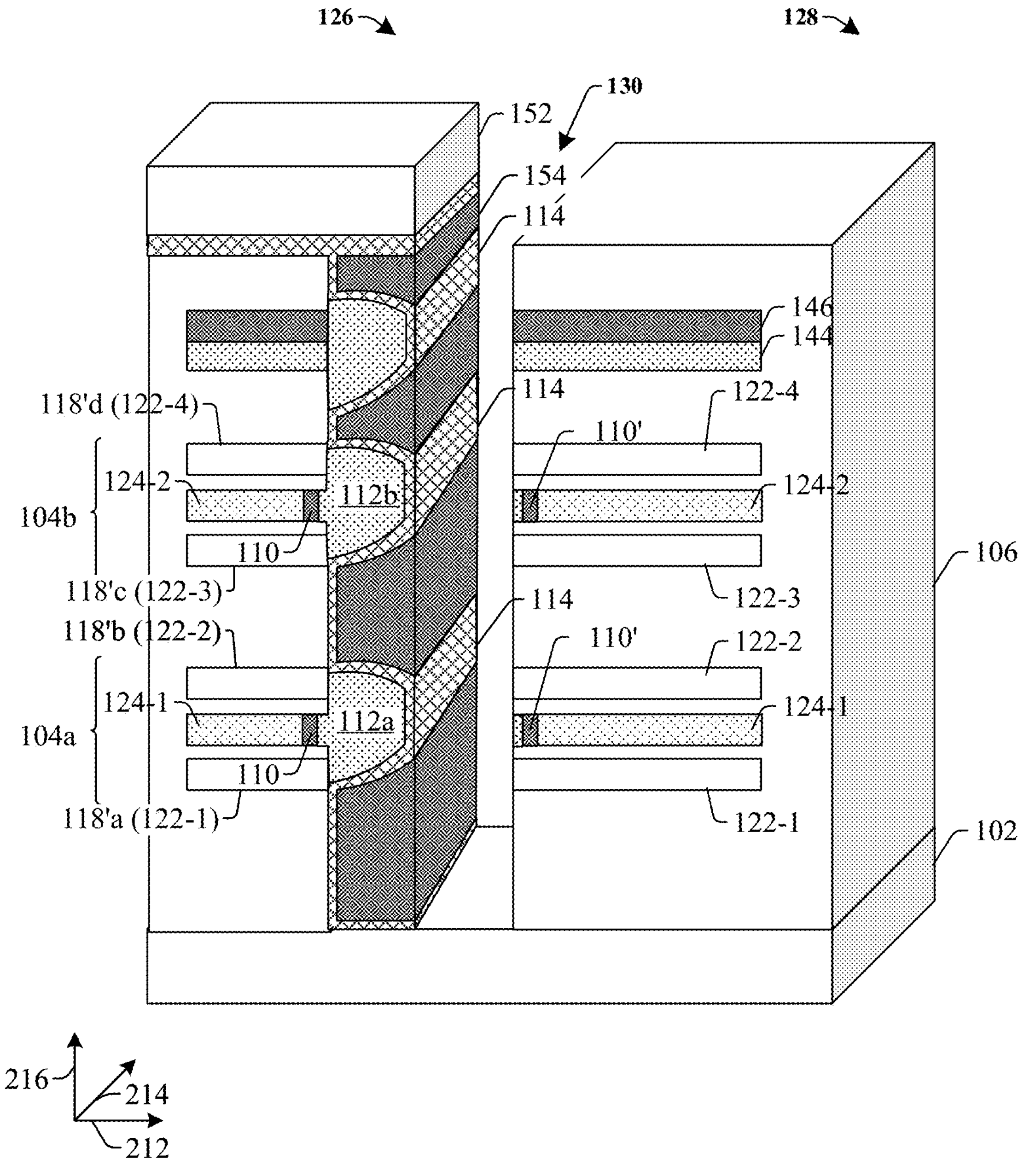
Figure 21:
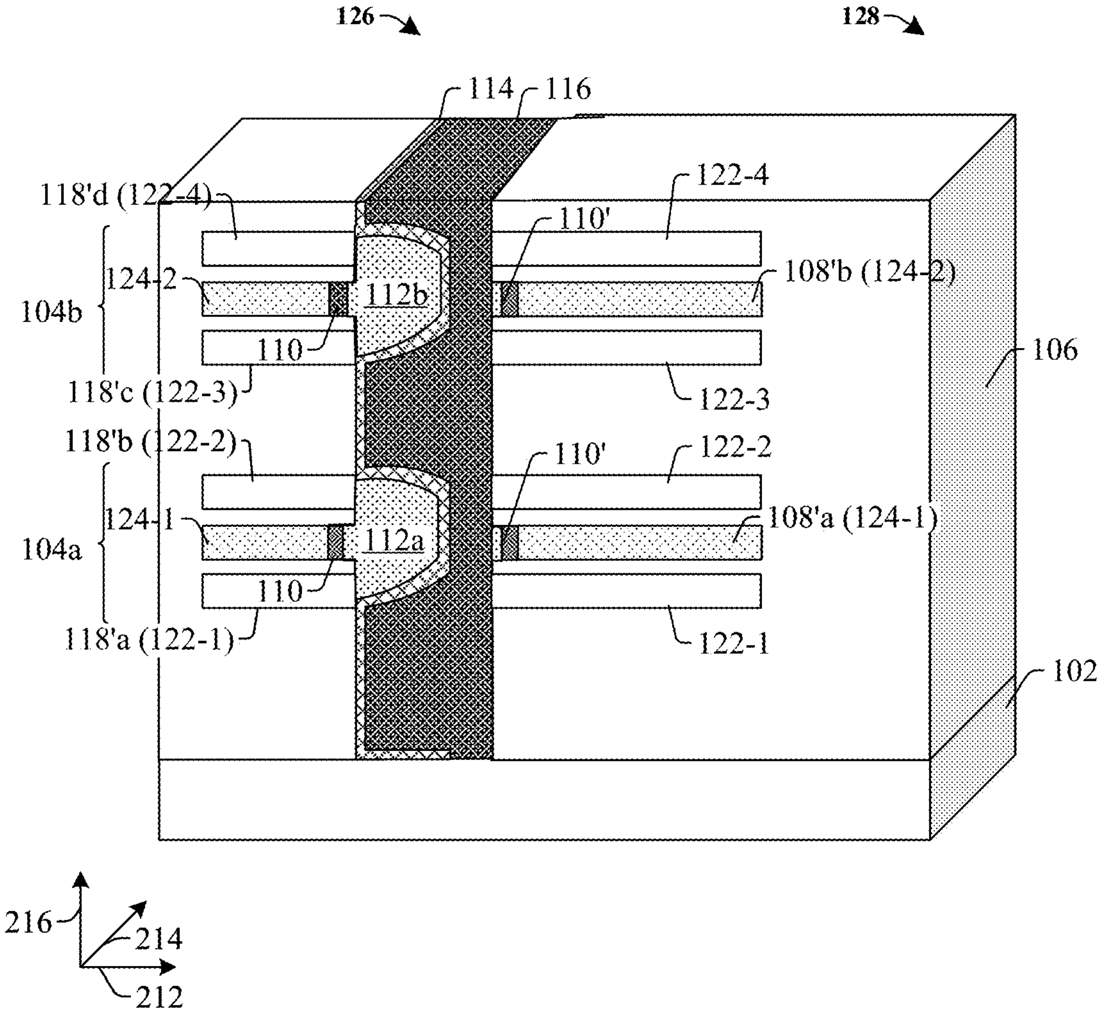

After forming the floating gates 112*a*, 112*b*, as shown in FIG. 20, a gate dielectric 114 is formed along surfaces of the floating gates 112*a*, 112*b*. In some embodiments, the gate dielectric 114 may be continuously extended across the surfaces of the floating gates 112*a*, 112*b*. The gate dielectric 114 may be or be comprised of high-k dielectric material such as hafnium oxide ($HFO_2$), aluminum oxide ($Al_2O_3$), hafnium zirconium oxide (HfZrO), or the like. For example, in some embodiments, the gate dielectric 114 is conformally deposited on exposed surfaces of the work piece lining sidewall and bottom surfaces of the vertical trench 130. Then a second filling structure 154 is formed within a remaining space of the vertical trench 130, followed by a vertical etch with a second stack of masking layers 152 in place to remove exposed portions of the gate dielectric 114. The second stack of masking layers 152 may comprise one or more of organic material, dielectric material, and metal material. As shown in FIG. 21, the second stack of masking layers 152 is removed. A channel layer 116 is formed within a remaining space of the trench 130. A planarization process (e.g., a chemical-mechanical planarization (CMP) process) is then performed.

Figure 22:
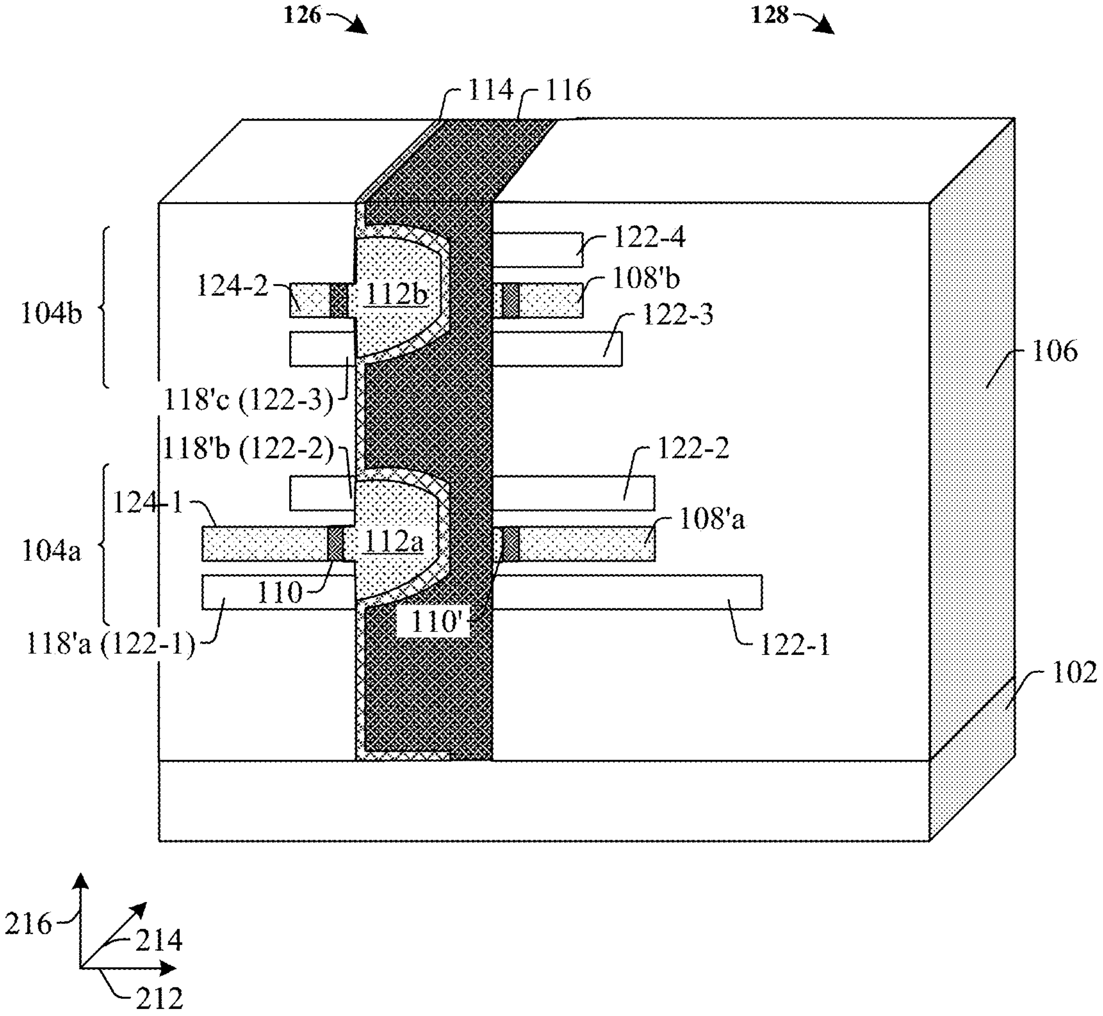

As shown in FIG. 22, in some embodiments, a "staircase" structure is formed to prepare for forming gate contact and source/drain contacts. As an example, on the first side 126, the upper dummy source/drain terminal 118'*b*, 118'*d* may be etched to be removed or shortened such that an upper surface of the semiconductor layers 124-1, 124-2 can be exposed to contact trenches to be formed vertically. Similarly, on the second side 128, the semiconductor layers 122-2, 122-3, 122-4 and the dummy control gate 108'*a*, 108'*b* can may be etched to be shortened such that an upper surface of the semiconductor layers 122-1, 122-2, 122-3 can be exposed to contact trenches to be formed vertically.

Figure 23:
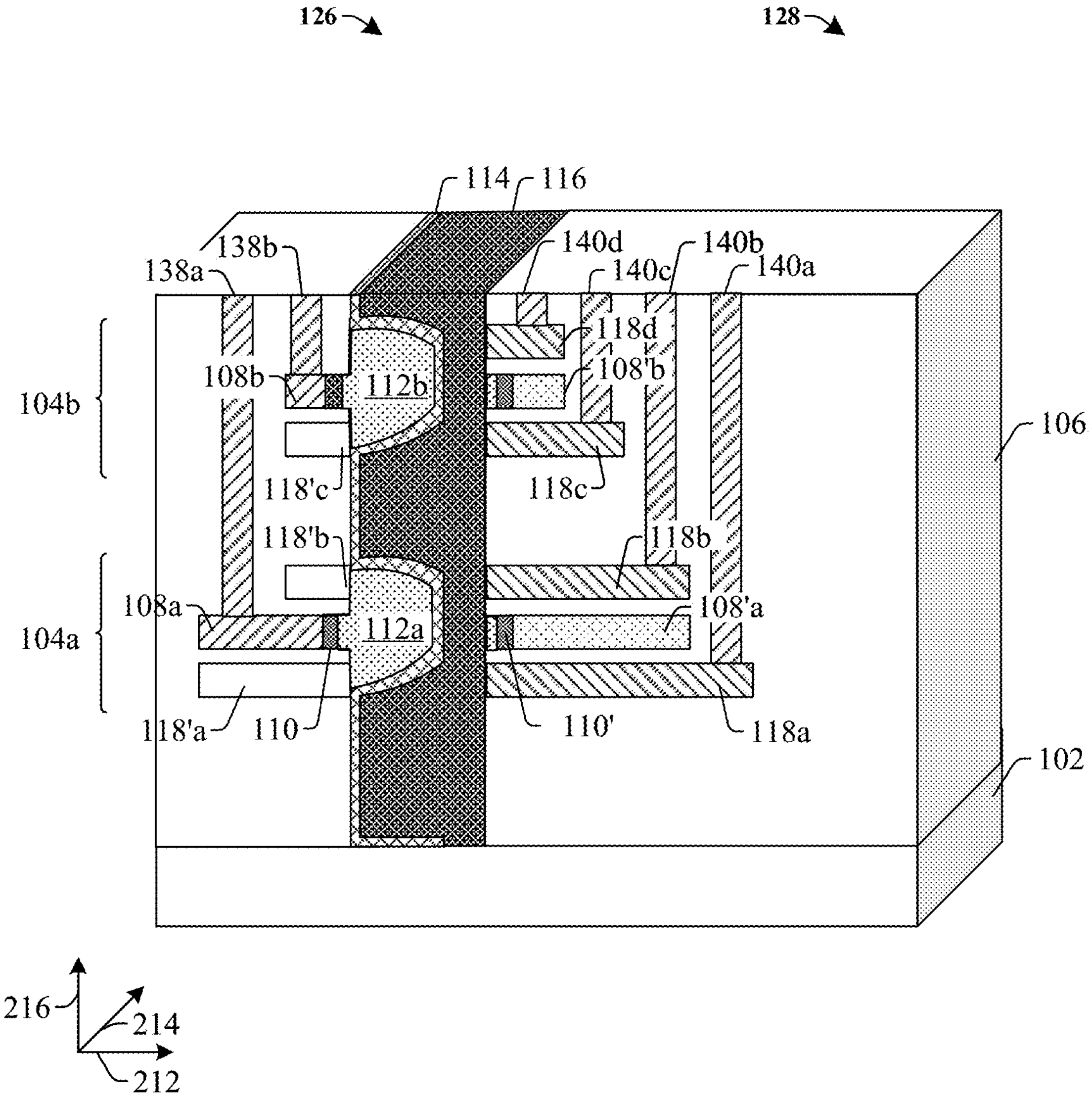

As shown in FIG. 23, in some embodiments, control gates 108*a*, 108*b* and source/drain terminal 118*a*, 118*c* may be formed by forming the contact trenches, removing the semiconductor layers 124-1, 124-2, and filling conductive material. Gate contacts 138*a*, 138*b* are formed within the contact trenches through the ILD layer 106 and reaching on the upper surface of the control gates 108*a*, 108*b*. Source/drain contacts 140*a-d* are formed within the contact trenches through the ILD layer 106 and respectively reaching on the upper surface of the lower source/drain terminal 118*a*, 118*c* and the upper source/drain terminal 118*b*, 118*d*. The contacts 138*a-b* and 140*a-d* may be extended and coupled to interconnect wires of one single metal layer or to interconnect wires of different metal layers for a more flexible wire routing.

FIGS. 24-33 illustrate a series of 3D views of some further embodiments of a method of forming a memory device with stackable memory cells 104*a*, 104*b*. Although FIGS. 24-33 are described as a series of acts that corresponds to form a memory device similar to the memory device described in FIG. 10, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 24:
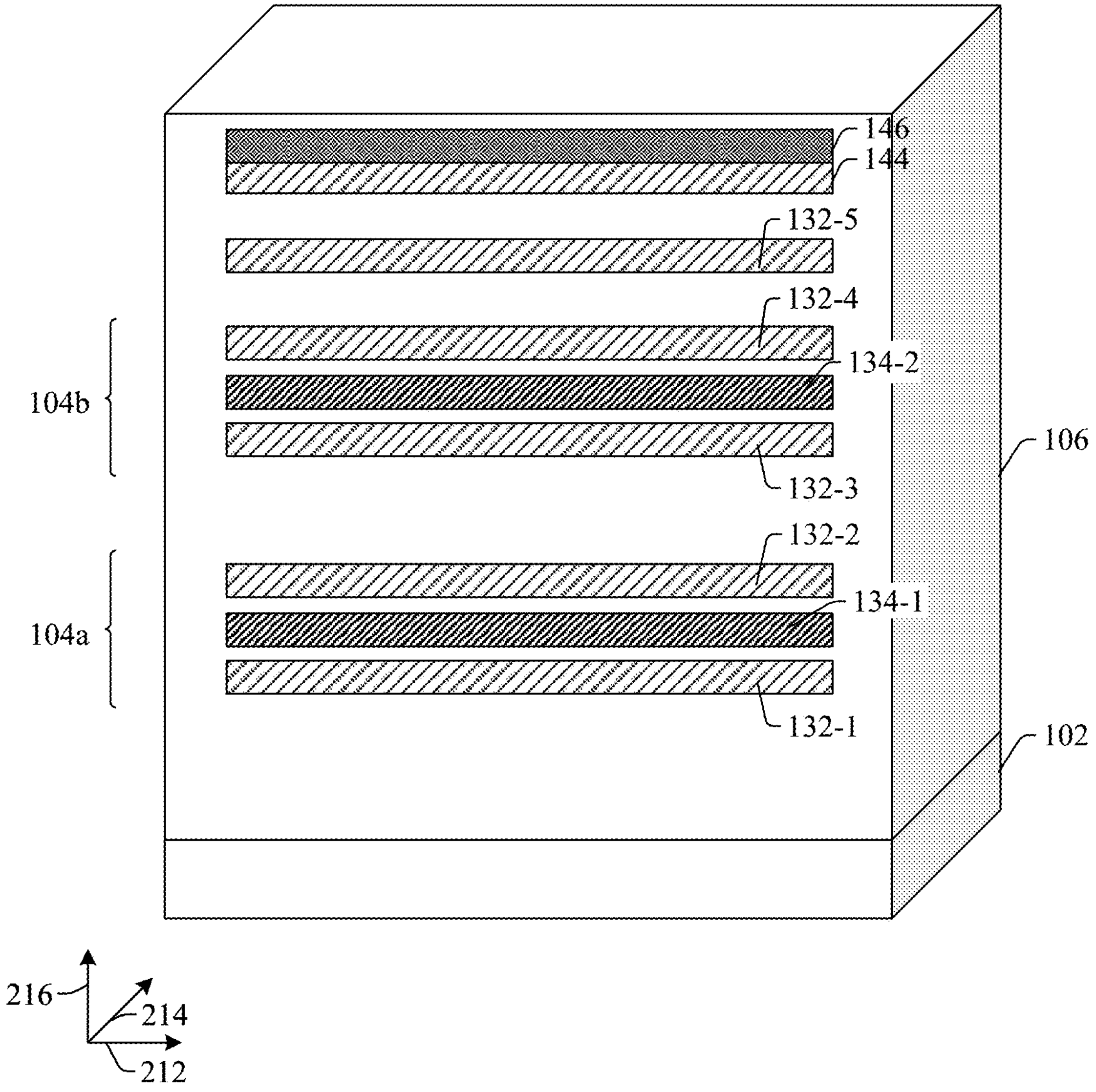
FIGS. 24-33 illustrate a series of 3D views of some further embodiments of a method of forming a memory device with stackable memory cells.

As shown in FIG. 24, in some embodiments, a stack of source/drain precursor layers 132 (e.g. 132-1, 132-2, 132-3, 132-4, 132-5 . . . ) and gate precursor layers 134 (e.g. 134-1, 134-2 . . . ) are formed over the substrate 102 within the ILD layer 106. The stack of the source/drain precursor layers 132 and the gate precursor layers 134 may be formed by a series of deposition processes such as chemical vapor deposition (CVD), physical vapor deposition (PVD), or other suitable deposition process. A plurality of dielectric material deposition may be performed between the forming of the source/drain precursor layers 132 and the gate precursor layers 134 to form the ILD layer 106. The source/drain precursor layers 132 and the gate precursor layers 134 are of different metal or other conductive materials. For example, the source/drain precursor layers 132 (e.g. 132-1, 132-2) may be or be comprised of a first metal material, such as titanium nitride (TiN), while the gate precursor layers 134 may be or be comprised of a second metal material, such as Nickle (Ni). Other candidate material for the source/drain precursor layers 132 or the gate precursor layers 134 may include, for example, one of tungsten (W), copper (Cu), ruthenium (Ru), cobalt (Co), heavily doped silicon, a combination of the foregoing, or the like. The first metal material and the second metal material may be selected such that an etching selectivity is high (e.g., 10:1 or higher) such that one metal is etched preferentially over the other during a subsequent process of recessing the gate precursor layers 134.

Figure 25:
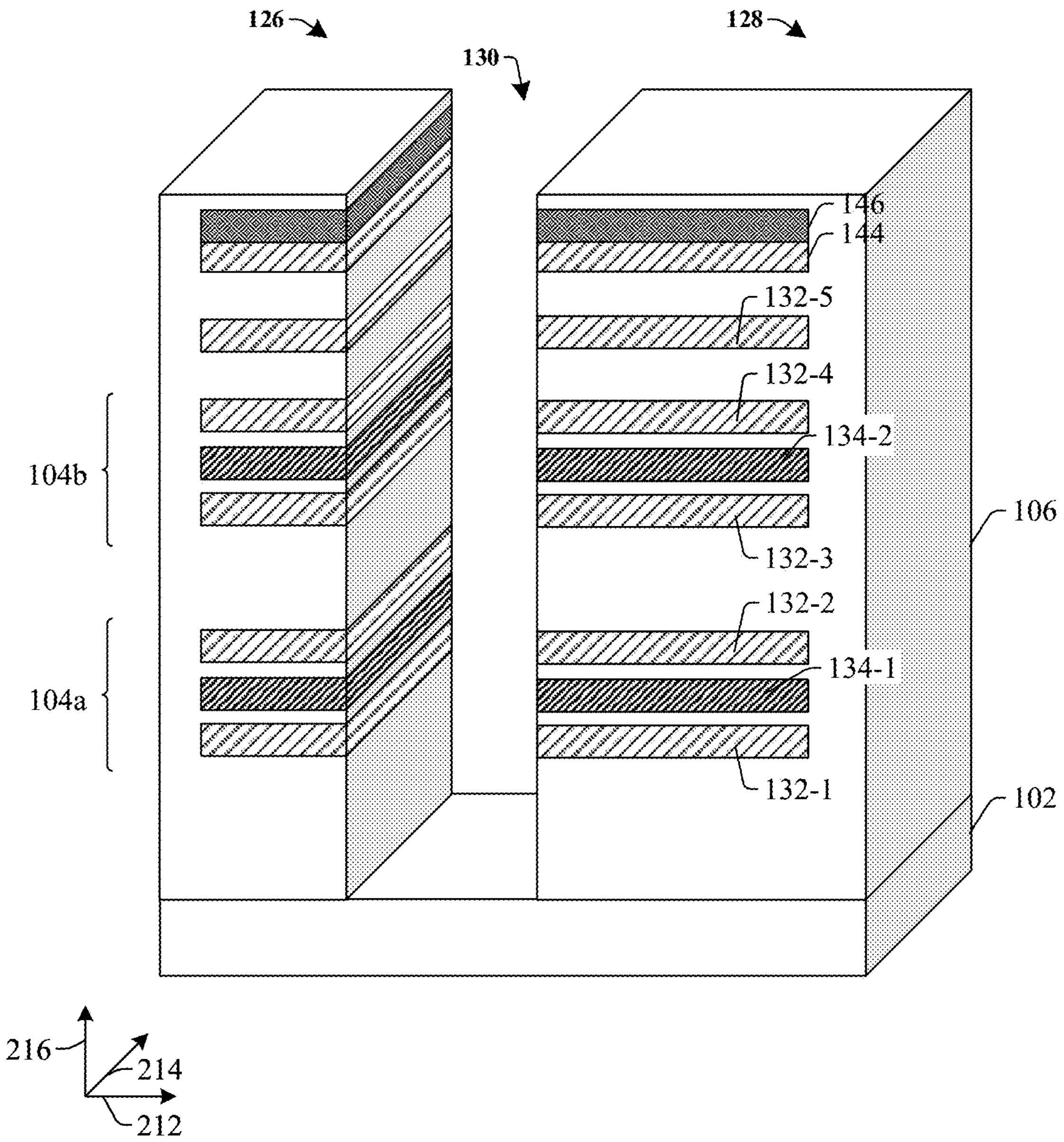

As shown in FIG. 25, in some embodiments, a vertical trench 130 is formed through the ILD layer 106 and laterally separating the source/drain precursor layers 132 and the gate precursor layers 134 on a first side 126 and a second side 128. The vertical trench 130 may be performed by a series of etching processes with a mask in place. An etch stop layer may be formed over the FEOL devices or one or more lower interconnects, such that the series of etching processes can be stop on the etch stop layer.

Figure 26:
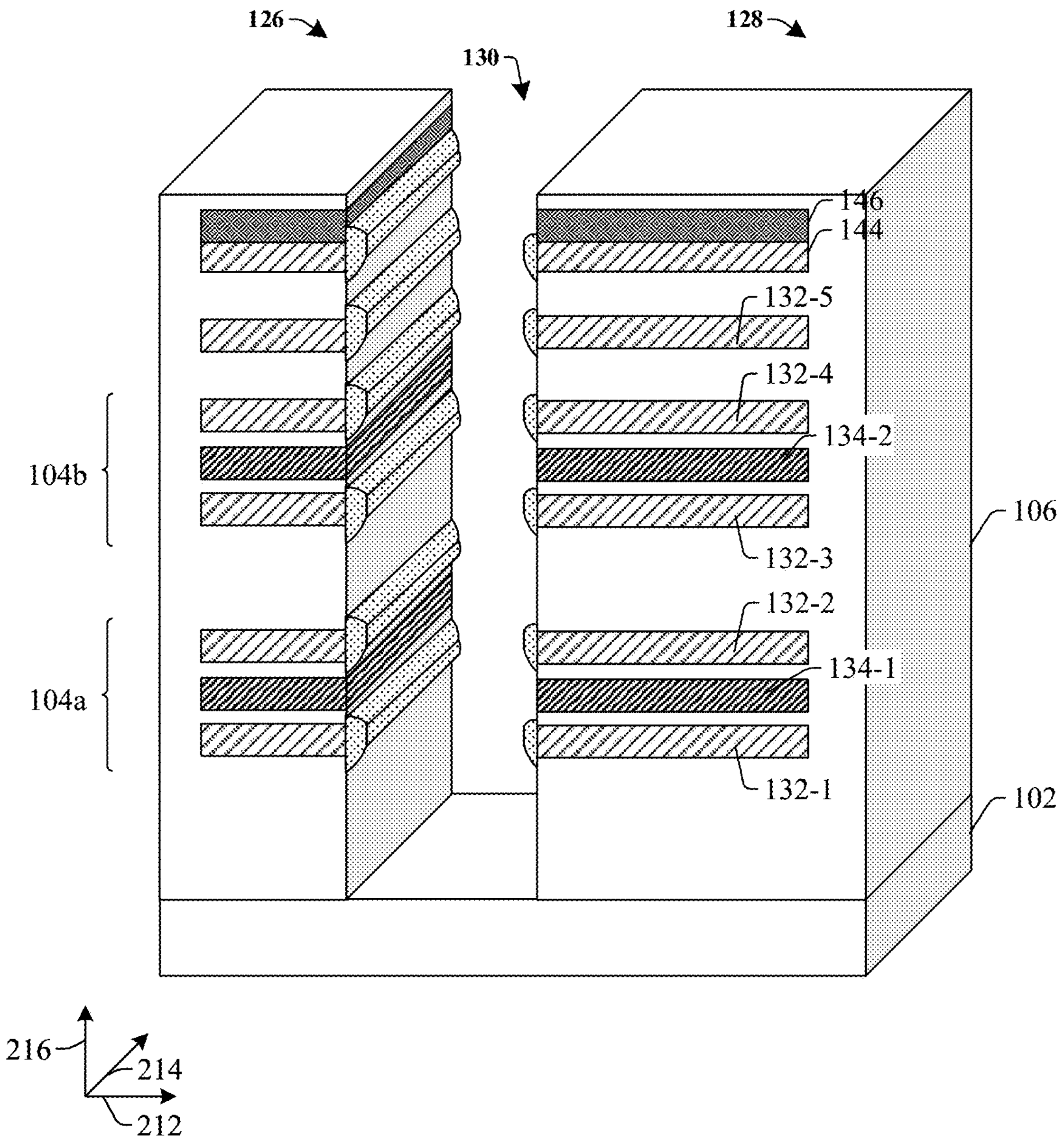
Figure 27:
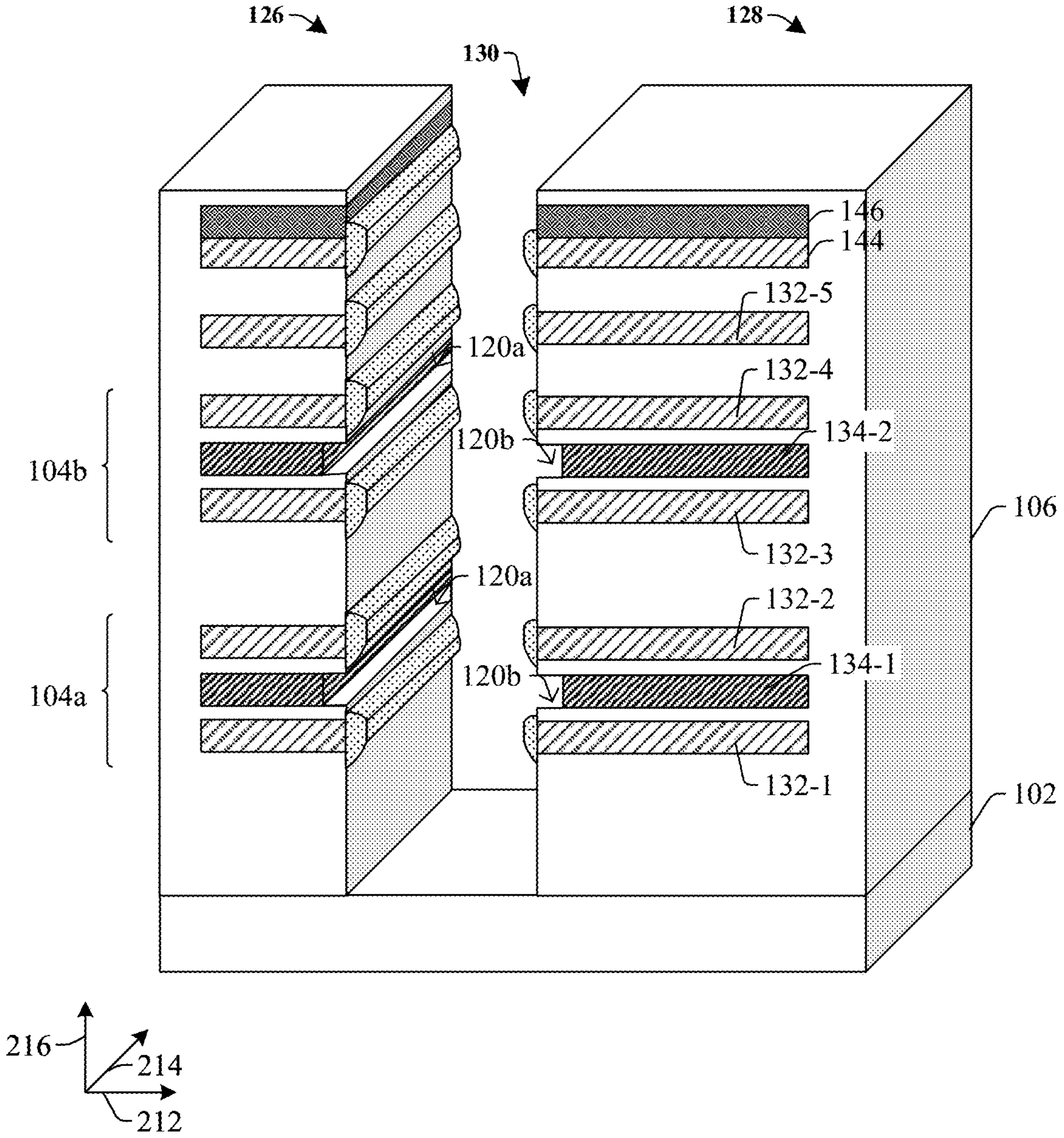
Figure 28:
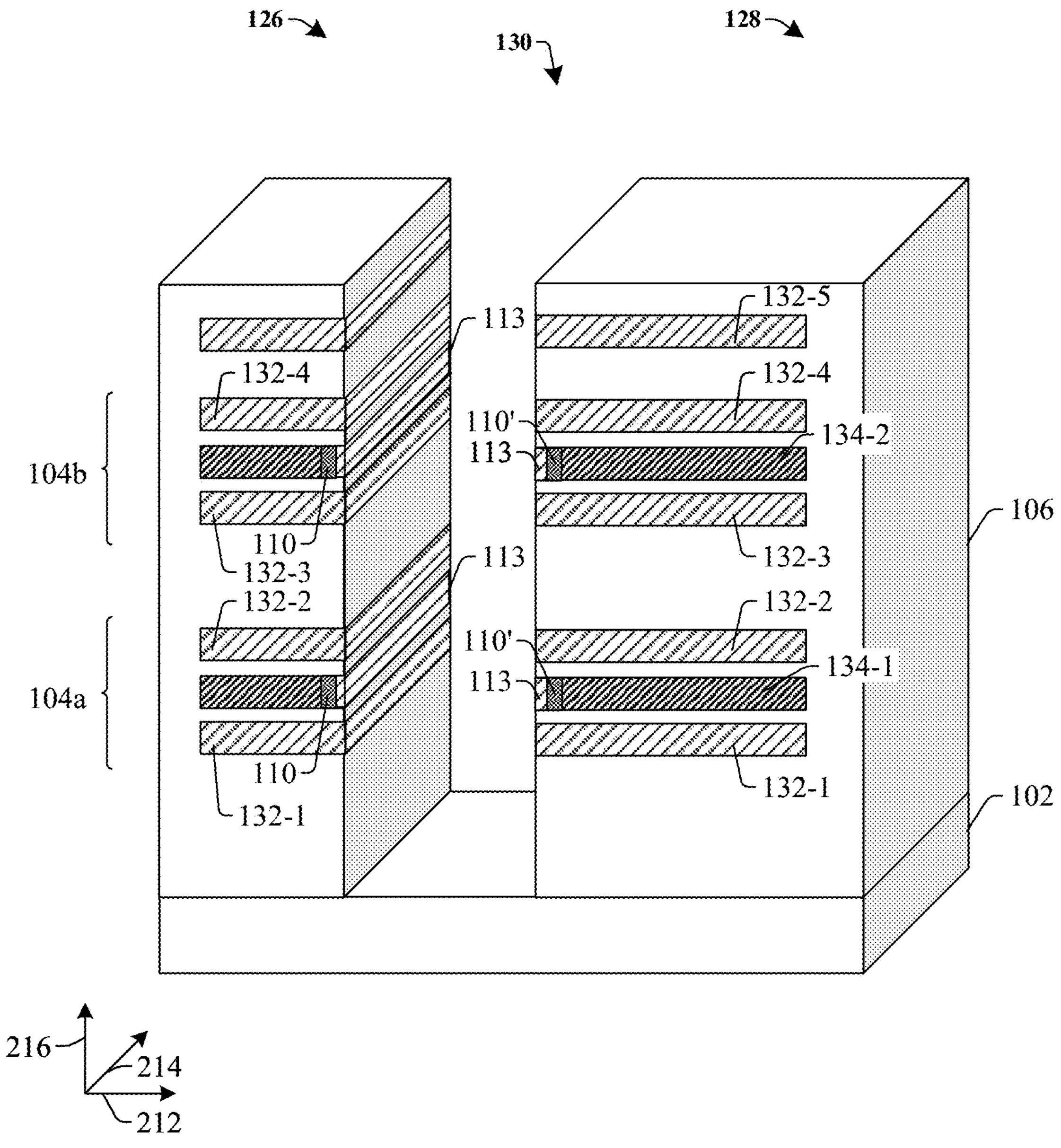

As shown in FIGS. 26-28, in some embodiments, a tunnel dielectric 110 is formed on the first side 126, and a dummy tunnel dielectric 110' is formed on the second side 128, contacting the gate precursor layers 134. As shown in FIG. 26, in some embodiments, a selective oxidation may be performed to form an oxidation film on the source/drain precursor layers 132. As shown in FIG. 27, in some embodiments, an etch or a series of etching processes is performed to form recesses 120*a*, 120*b* on the gate precursor layers 134. By forming the oxidation film prior to forming the recesses, the source/drain precursor layers 132 are protected from being altered during the formation of the recesses. The oxidation film may be subsequently removed by an etch.

Then, as shown in FIG. 28, a tunnel dielectric precursor is deposited to fill the recesses 120*a*, 120*b*, followed by a vertical etch removing exposed portions of the tunnel dielectric precursor and retaining the portion of the tunnel dielectric precursor within the recesses 120*a* on the first side 126 as the tunnel dielectric 110 and within the recesses 120*b* on the second side 128 as the dummy tunnel dielectric 110'. The tunnel dielectric 110 and the dummy tunnel dielectric 110' may be formed of silicon nitride for example, or other suitable dielectric material. In some embodiments, the tunnel dielectric 110 and the dummy tunnel dielectric 110' are subsequently recessed, leaving space for forming floating gates. Still as shown in FIG. 28, a floating gate precursor 113 is then formed within the recesses of the tunnel dielectric 110 and the dummy tunnel dielectric 110'. The floating gate precursor 113 may be formed by conformally depositing metal, such as TiN, on exposed surfaces of the work piece followed by a vertical etch to remove exposed portions and retain the portion within the recesses of the tunnel dielectric 110 and the dummy tunnel dielectric 110' as the floating gate precursor 113.

Figure 29:
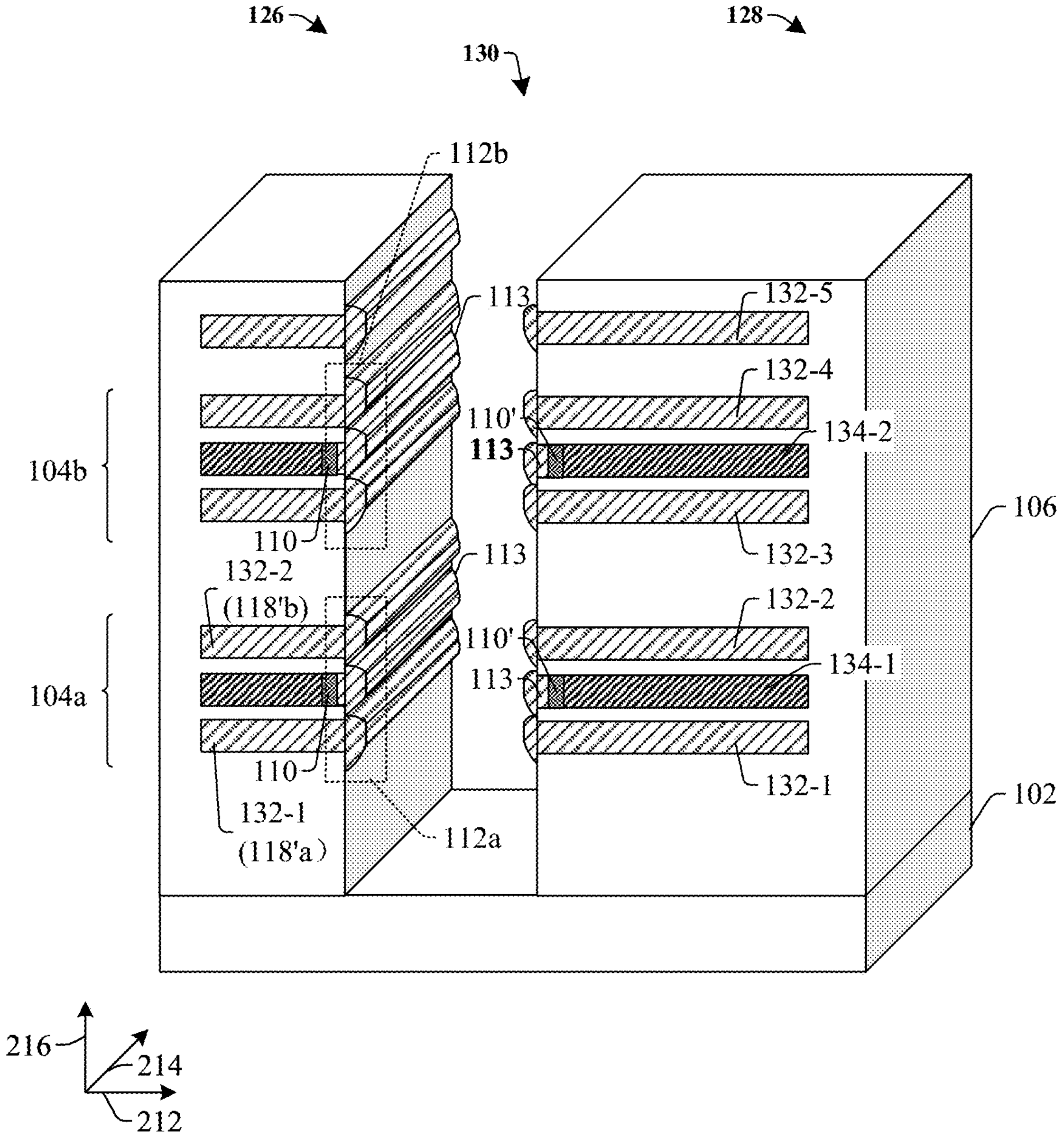

As shown in FIG. 29-32, in some embodiments, a floating gate 112, a gate dielectric 114, and a channel layer 116 are formed within the vertical trench 130. The floating gate 112, the gate dielectric 114, and the channel layer 116 may be formed by a series of deposition processes respectively filling the vertical trench 130 and then partially removed by vertical etching processes. For example, as shown in FIG. 29, in some embodiments, the floating gate precursor 113 is extended by a selective metal deposition from the floating gate precursor 113 and also deposited on the source/drain precursor layers 132 such as 132-1, 132-2, 132-3, 132-4, and 132-5. As a result, a plurality of conductive bumps is respectively formed contacting the tunnel dielectric 110, the dummy tunnel dielectric 110', and the source/drain precursor layers 132. In some embodiments, a group of consecutive conductive bumps, such as three conductive bumps extended respectively from lower and upper source/drain precursor layers 132 (e.g., 132-1 & 132-2 or 132-3 & 132-4) and the tunnel dielectric 110 there-between, form a floating gate 112*a* or 112*b*. By forming the floating gates 112*a*, 112*b* vertically extended beyond the tunnel dielectric 110 and even beyond the respective lower and upper source/drain precursor layers 132, i.e., dummy source/drain terminals 118'*a*, 118'*b* to be formed, the volume of the floating gates 112*a*, 112*b* is enlarged, and more carriers can be saved in the floating gates.

Figure 30:
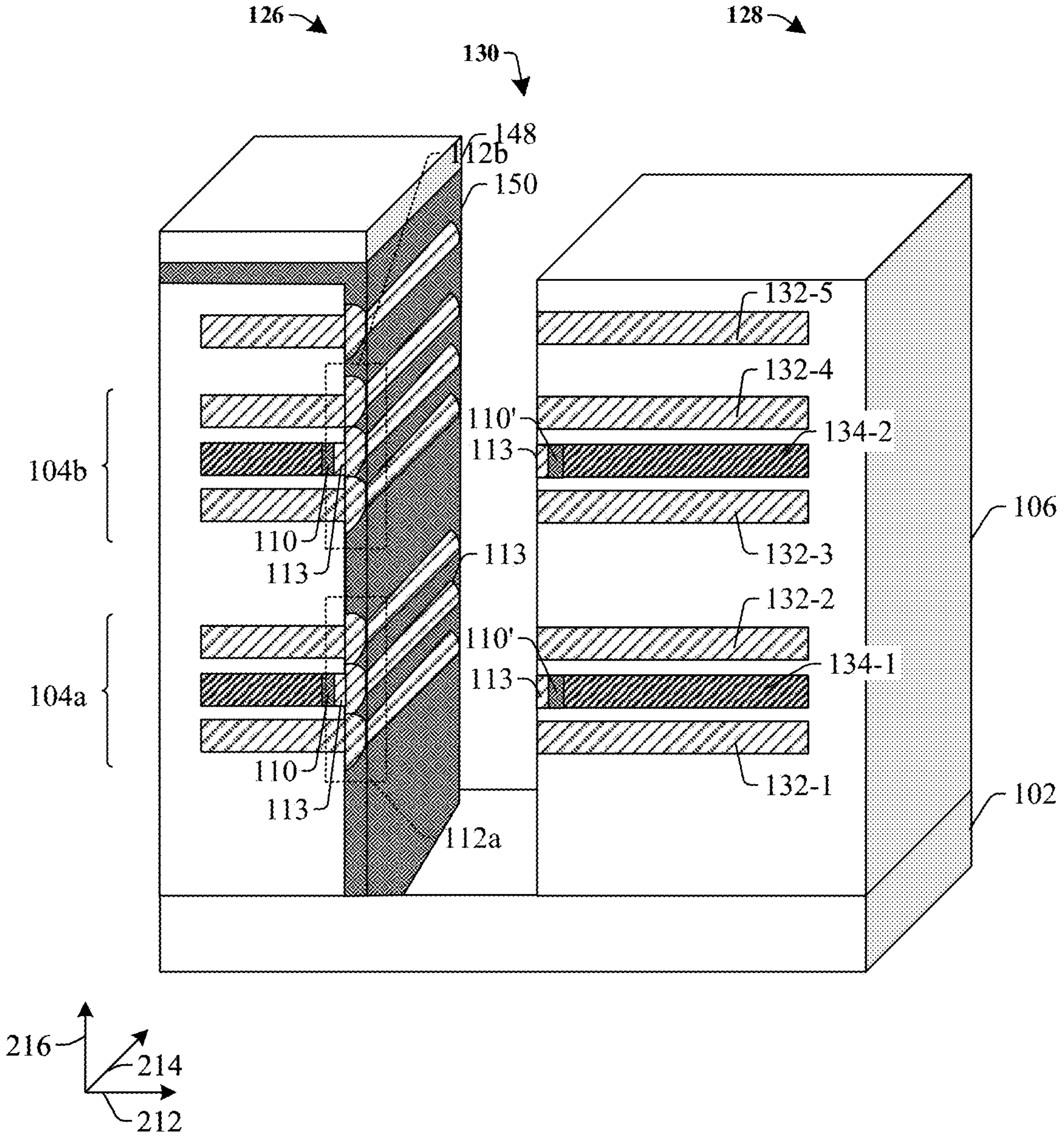

As shown in FIG. 30, a first filling structure 150 is formed within the trench 130 and then patterned to protect the floating gates 112*a*. 112*b* when removing a half of the conductive bumps closer to the second side 128 and to form floating gates 112*a*, 112*b* spaced from one another. A first stack of masking layers 148 may be used to expose the half of the floating gate precursors 113 for a series of etching processes. As an example, the first stack of masking layers 148 may comprise one or more of organic material, dielectric material, and metal material.

Figure 31:
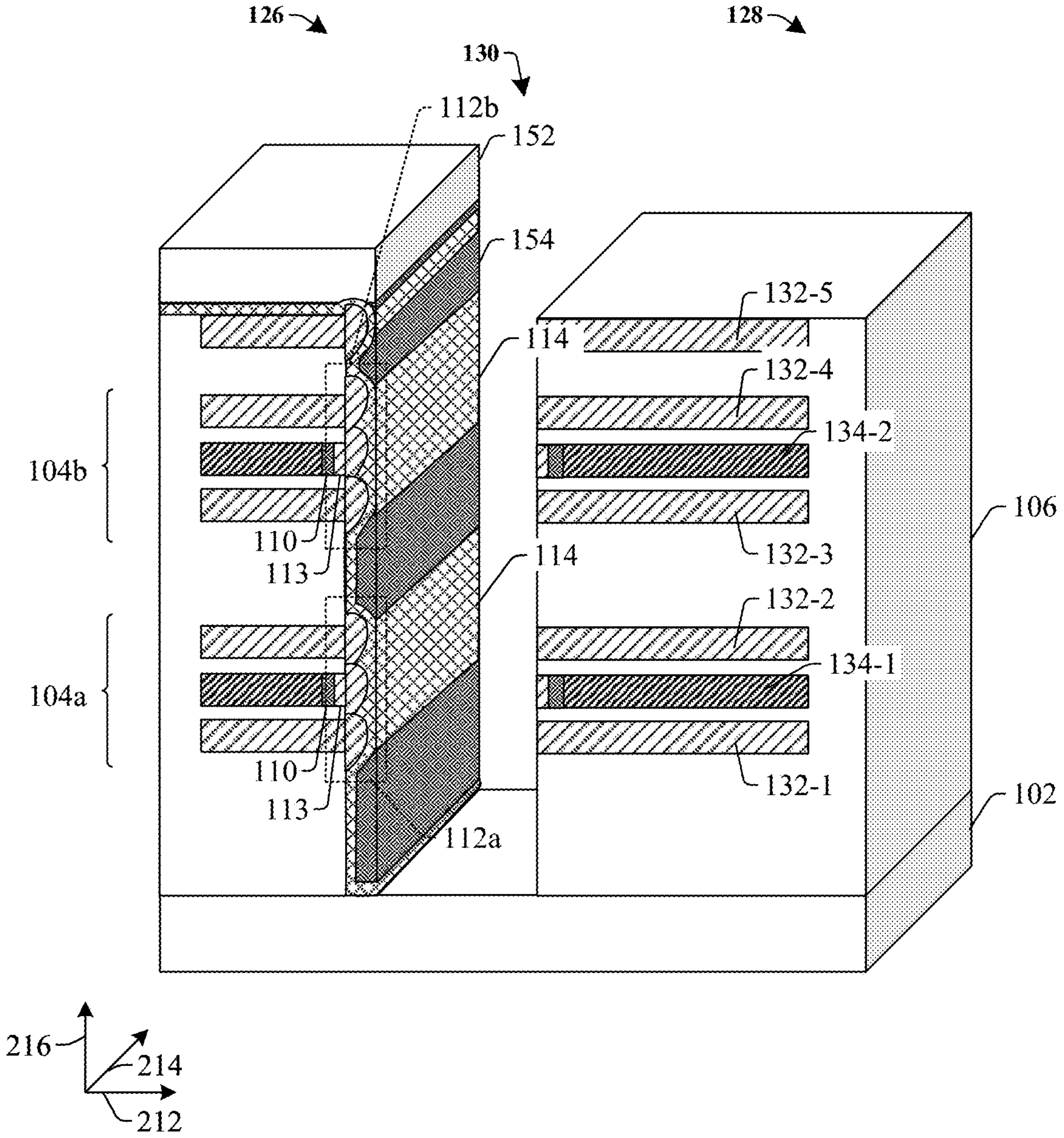
Figure 32:
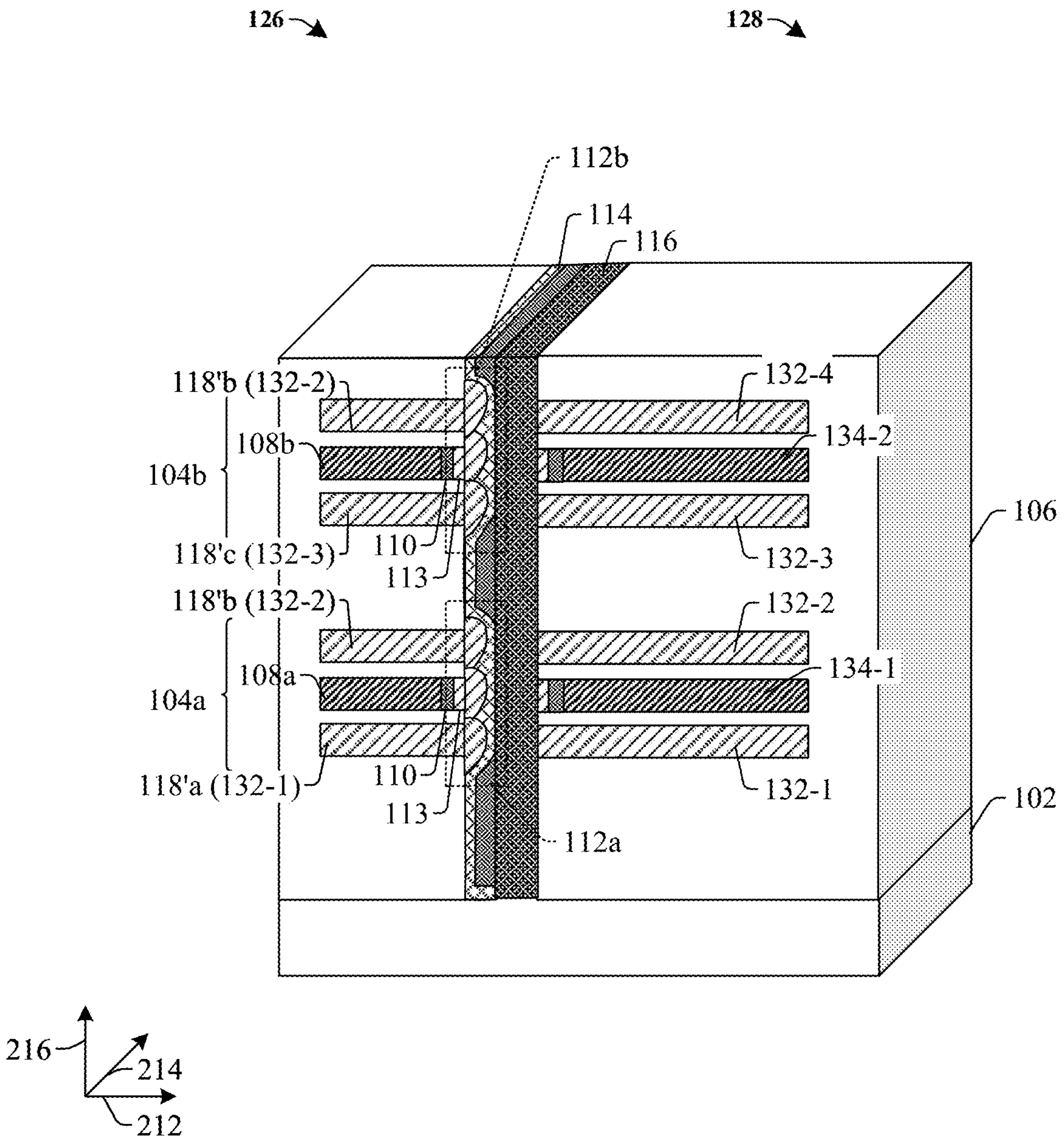

As shown in FIG. 31, a gate dielectric 114 is formed along surfaces of the floating gates 112*a*, 112*b*. In some embodiments, the gate dielectric 114 may be continuously extended across the surfaces of the floating gates 112*a*, 112*b*. The gate dielectric 114 may be or be comprised of high-k dielectric material such as hafnium oxide ($HFO_2$), aluminum oxide ($Al_2O_3$), hafnium zirconium oxide (HfZrO), or the like. For example, in some embodiments, the gate dielectric 114 is conformally deposited on exposed surfaces of the work piece lining sidewall and bottom surfaces of the vertical trench 130. Then a second filling structure 154 is formed within a remaining space of the vertical trench 130, followed by a vertical etch with a second stack of masking layers 152 in place to remove exposed portions of the gate dielectric 114. The second stack of masking layers 152 may comprise one or more of organic material, dielectric material, and metal material. The second stack of masking layers 152 is subsequently removed. As shown in FIG. 32, a channel layer 116 is formed within a remaining space of the trench 130. A planarization process (e.g., a chemical-mechanical planarization (CMP) process) is then performed.

Figure 33:
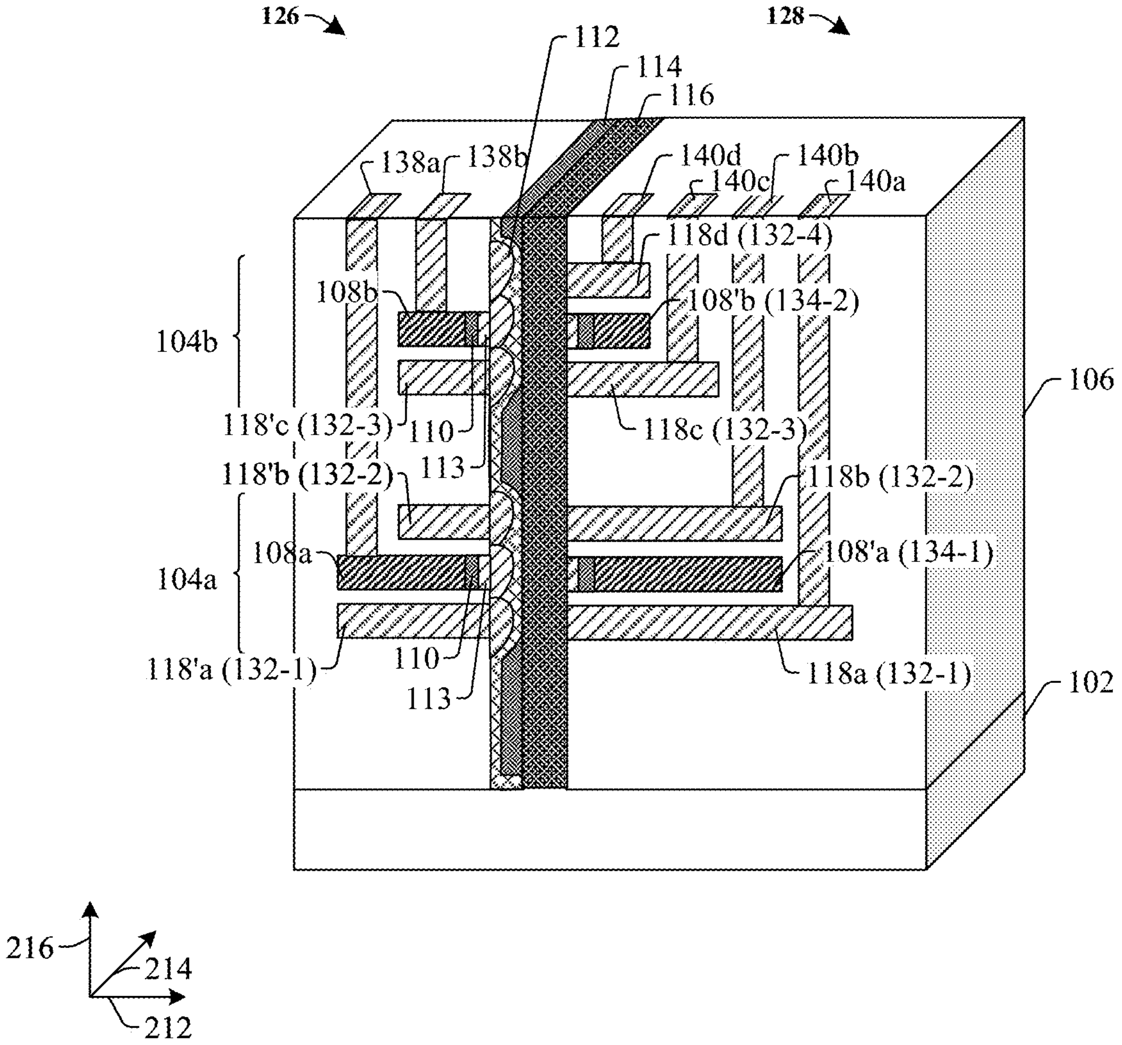

As shown in FIG. 33, in some embodiments, a "staircase" structure is formed to prepare for forming gate contact and source/drain contacts. As an example, on the first side 126, dummy source/drain terminal 118'*b-d* may be etched to be removed or shortened such that an upper surface of the first control gate 108*a* can be reachable by the first gate contact 138*a* vertically formed. Similarly, on the second side 128, the first dummy control gate 108'*a* and the source/drain terminal 118*b* can be etched to be shortened a first distance such that an upper surface of the source/drain terminal 118*a* can be reachable by the first source/drain contact 140*a* vertically formed. The source/drain terminal 118*c* can be etched to be shortened a second distance such that an upper surface of the source/drain terminal 118*b* can be reachable by the second source/drain contact 140*b* vertically formed. The second dummy control gate 108'*b* and the source/drain terminal 118*d* can be etched to be shortened a third distance such that an upper surface of the source/drain terminal 118*c* can be reachable by the third source/drain contact 140*c* vertically formed. The contacts 138*a-b* and 140*a-d* may be extended and coupled to interconnect wires of one single metal layer or to interconnect wires of different metal layers for a more flexible wire routing.

Therefore, the present disclosure relates to a BEOL flash memory structure including stackable memory cells that includes control gates and pairs of source/drain terminals disposed at opposite sides of a channel layer extended in a vertical direction. By arranging the channel layer in the vertical direction memory cells are easily stacked one over another, and thus achieving a more compact integration for higher memory cell density. More specific details examples have been discussed in various embodiments of the disclosure.

In some embodiments, the disclosure relates to a memory cell. A channel layer is disposed over a substrate and extended along a vertical direction in perpendicular to a surface of the substrate. A floating gate is disposed over the substrate and separated from the channel layer by a gate dielectric along a first lateral direction perpendicular to the vertical direction. A control gate is disposed on one side of the floating gate and the channel layer along the first lateral direction and separated from the floating gate by a tunnel dielectric. A pair of source/drain terminals is disposed on the other side of the channel layer and the floating gate opposite to the control gate.

In some other embodiments, the disclosure relates to an integrated device. A channel layer is disposed over a substrate and extended along a vertical direction in perpendicular to a surface of the substrate. A gate dielectric is disposed on one side of the channel layer and extended along the vertical direction. A first floating gate is disposed in a first memory cell region next to the gate dielectric and separated from the channel layer by the gate dielectric. A first control gate is disposed on one side of the first floating gate opposite to the channel layer and separated from the first floating gate by a first tunnel dielectric. A second floating gate is stacked over the first floating gate and also disposed next to the gate dielectric and separated from the channel layer by the gate dielectric. A second control gate is disposed on one side of the second floating gate opposite to the channel layer and separated from the second floating gate by a second tunnel dielectric.

In yet other embodiments, the disclosure relates to a method of forming an integrated device. The method includes forming a first source/drain precursor layer, a gate precursor layer, and a second source/drain precursor layer one stacked over another separated by an interlayer dielectric (ILD) layer over a substrate. The method further includes forming a vertical trench separating the first source/drain precursor layer, the gate precursor layer, and the second source/drain precursor layer to a first side and a second side in lateral and forming a floating gate, a gate dielectric, and a channel layer within the vertical trench. The method further includes patterning the first source/drain precursor layer, the gate precursor layer, and the second source/drain precursor layer to form a first dummy source/drain terminal, a control gate, and a second dummy source/drain terminal on the first side and to form a first source/drain terminal, a dummy control gate, and a second source/drain terminal on the second side.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated device, comprising:

forming a first source/drain precursor layer, a gate precursor layer, and a second source/drain precursor layer one stacked over another separated by an interlayer dielectric (ILD) layer over a substrate;

forming a vertical trench separating the first source/drain precursor layer, the gate precursor layer, and the second source/drain precursor layer to a first side and a second side in lateral;

forming a floating gate, a gate dielectric, and a channel region within the vertical trench; and patterning the first source/drain precursor layer, the gate precursor layer, and the second source/drain precursor layer to form a first dummy source/drain terminal, a control gate, and a second dummy source/drain terminal on the first side and to form a first source/drain terminal, a dummy control gate, and a second source/drain terminal on the second side.

2. The method of claim 1, further comprising forming a tunnel dielectric on the first side and a dummy tunnel dielectric on the second side contacting the gate precursor layer after the forming of the vertical trench.

3. The method of claim 2, wherein the floating gate is formed by forming a floating gate precursor within a recess of the tunnel dielectric, selectively depositing a metal material on the floating gate precursor, and patterning the metal material to form the floating gate.

4. The method of claim 3, wherein the metal material is also deposited on the first source/drain precursor layer and the second source/drain precursor layer by forming three consecutive bumps as the floating gate.

5. The method of claim 1, further comprising:

forming a control gate contact through the ILD layer reaching the control gate and a first source/drain contact and a second source/drain contact respectively reaching the first source/drain terminal and the second source/drain terminal; and wherein the control gate, the first source/drain contact, and the second source/drain contact are formed by replacing the patterned first source/drain precursor layer, the gate precursor layer, and the second source/drain precursor layer with conductive material.

6. A method, comprising:

forming a pair of source/drain terminals over a substrate in a vertical direction perpendicular to a surface of the substrate;

forming a control gate precursor vertically between the pair of source/drain terminals;

forming a trench in the vertical direction separating the control gate precursor to a control gate and a dummy control gate;

etching a recess at one side of the control gate and filling the recess with a tunnel dielectric;

depositing and patterning a floating gate within the trench and separated from the control gate by the tunnel dielectric; and forming a channel region within the trench vertically along the floating gate and separated from the floating gate by a gate dielectric.

7. The method of claim 6, wherein the pair of source/drain terminals and the control gate are formed at opposite sides of the trench.

8. The method of claim 6, wherein the dummy control gate is formed on the other side of the channel region opposite to the control gate.

9. The method of claim 6, wherein the pair of source/drain terminals is formed on the other side of the floating gate opposite to the control gate.

10. The method of claim 6, wherein the pair of source/drain terminals is formed by forming a source/drain precursor prior to forming the trench, and wherein the trench separates the source/drain precursor to a pair of dummy source/drain terminals and the pair of source/drain terminals.

11. The method of claim 10, wherein the floating gate is formed with a deposition process to form multiple bumps respectively contacting the tunnel dielectric and the pair of dummy source/drain terminals.

12. The method of claim 10, wherein the source/drain precursor and the control gate precursor are of different semiconductor materials.

13. The method of claim 6, further comprising:

forming a first source/drain contact on an upper surface of a first source/drain terminal of the pair of source/drain terminals; and forming a second source/drain contact on an upper surface of a second source/drain terminal of the pair of source/drain terminals, wherein the first source/drain contact and the second source/drain contact are laterally shifted from one another and extend upwardly along the vertical direction.

14. The method of claim 6, wherein the control gate and the pair of source/drain terminals are extended along a surface of the substrate and spaced from the substrate by an inter-level dielectric (ILD) layer.

15. The method of claim 14, wherein the floating gate is formed with a straight first sidewall and a convex-shaped second sidewall.

16. A method, comprising:

forming a control gate precursor and a source/drain precursor stacked in a vertical direction perpendicular to a lateral surface of a substrate;

performing an etching process to form a trench in the vertical direction to cut through the control gate precursor and the source/drain precursor and form a control gate and a pair of source/drain terminals at opposite sides of the trench; and within the trench, forming a channel region, a gate dielectric, and a floating gate along the control gate and between the pair of source/drain terminals.

17. The method of claim 16, wherein a dummy control gate and a pair of dummy source/drain terminals are formed at opposite sides of the trench.

18. The method of claim 16, wherein the trench separates the source/drain precursor into a pair of dummy source/drain terminals at one side and the pair of source/drain terminals at the other side.

19. The method of claim 16, wherein the trench separates the control gate precursor into the control gate at one side and a dummy control gate at the other side.

20. The method of claim 16, wherein the floating gate is formed with a plurality of bump-shaped metal components each with a convex sidewall contacting the gate dielectric.

* * * * *